(12) United States Patent  
Hochberg et al.

(10) Patent No.: US 8,909,003 B1  
(45) Date of Patent: Dec. 9, 2014

(54) LOW-NOISE AND HIGH BANDWIDTH ELECTRIC FIELD SENSING WITH SILICON-POLYMER INTEGRATED PHOTONICS AND LOW DRIVE VOLTAGE MODULATOR FIBER-BASED ANTENNA LINK

(75) Inventors: Michael J. Hochberg, Seattle, WA (US); Tom Baehr-Jones, Seattle, WA (US)

(73) Assignee: University of Washington Through Its Center For Commercialization, Seattle, WA (US)

( * ) Notice: Subject to any disclaimer, the term of this patent is extended or adjusted under 35 U.S.C. 154(b) by 442 days.

(21) Appl. No.: 12/690,070

(22) Filed: Jan. 19, 2010

Related U.S. Application Data

(60) Provisional application No. 61/145,447, filed on Jan. 16, 2009, provisional application No. 61/145,438, filed on Jan. 16, 2009.

(51) Int. Cl.
*G02B 6/00* (2006.01)

(52) U.S. Cl.
USPC .................................................. 385/12; 385/2

(58) Field of Classification Search
USPC .................................................... 385/2, 12
See application file for complete search history.

(56) References Cited

U.S. PATENT DOCUMENTS

| | | | |
|---|---|---|---|
| 5,061,028 A | 10/1991 | Khanarian et al. | |
| 5,061,048 A | 10/1991 | Hayden et al. | |
| 5,309,531 A * | 5/1994 | Sheehy | ............................. 385/2 |
| 5,333,000 A | 7/1994 | Hietala et al. | |
| 5,543,805 A | 8/1996 | Thaniyavarn | |
| 5,654,818 A * | 8/1997 | Yao | ................................ 359/246 |
| 5,694,134 A | 12/1997 | Barnes | |
| 5,815,309 A | 9/1998 | Lawrence et al. | |
| 6,128,421 A | 10/2000 | Roberts | |
| 6,252,557 B1 * | 6/2001 | Plugge et al. | .................. 343/772 |

(Continued)

FOREIGN PATENT DOCUMENTS

| | | |
|---|---|---|
| JP | 06-075255 | 3/1994 |
| KR | 10-175743 | 5/1999 |
| WO | WO-2009/111610 | 9/2009 |
| WO | WO-2009/134506 | 11/2009 |

OTHER PUBLICATIONS

Barrios, et al., "Electrooptic Modulation of Silicon-on-Insulator Submicrometer-Size Waveguide Devices", Journal of Lightwave Technology vol. 21, No. 10; Oct. 2003, 2332-2339.

(Continued)

*Primary Examiner* — Uyen Chau N Le
*Assistant Examiner* — Chad Smith
(74) *Attorney, Agent, or Firm* — Dorsey & Whitney LLP

(57) ABSTRACT

An optical low drive voltage modulator electric field sensor device includes an electric field antenna. A low drive voltage modulator has an electrical voltage input electrically coupled to the electric field antenna, a light input, and a modulated light output. The optical low drive voltage modulator electric field sensor is configured to provide an optical output signal at the modulated light output having an optical parameter responsive to an electric field at the electric field antenna. The optical low drive voltage modulator electric field sensor device can also be configured to provide an RF output signal at a location physically remote from said antenna, where the RF output signal is responsive to an electromagnetic wave received at a remote antenna.

21 Claims, 20 Drawing Sheets

(56) References Cited

U.S. PATENT DOCUMENTS

| | | |
|---|---|---|
| 6,290,253 B1 | 9/2001 | Tietze et al. |
| 6,304,585 B1 | 10/2001 | Sanders et al. |
| 7,043,133 B2 | 5/2006 | Johnson et al. |
| 7,072,531 B2 | 7/2006 | Djordjev |
| 7,181,114 B2 | 2/2007 | Lee et al. |
| 7,200,308 B2 | 4/2007 | Hochberg et al. |
| 7,424,192 B2 | 9/2008 | Hochberg et al. |
| 7,474,811 B1 | 1/2009 | Quitoriano et al. |
| 7,643,714 B2 | 1/2010 | Hochberg et al. |
| 7,894,696 B2 | 2/2011 | Baehr-Jones et al. |
| 8,081,851 B2 | 12/2011 | Koos et al. |
| 8,380,016 B1 | 2/2013 | Hochberg et al. |
| 8,390,922 B1 | 3/2013 | Baehr-Jones et al. |
| 2002/0090160 A1 | 7/2002 | Lim et al. |
| 2003/0152346 A1 | 8/2003 | Aso et al. |
| 2004/0202429 A1 | 10/2004 | Margalit et al. |
| 2005/0074194 A1 | 4/2005 | Tan et al. |
| 2005/0111802 A1 | 5/2005 | Lee et al. |
| 2005/0242287 A1 | 11/2005 | Hakimi |
| 2006/0056760 A1 | 3/2006 | Djordjev et al. |
| 2006/0133720 A1 | 6/2006 | Hochberg et al. |
| 2007/0035800 A1 | 2/2007 | Hochberg et al. |
| 2007/0133918 A1 | 6/2007 | Cho et al. |
| 2008/0002992 A1* | 1/2008 | Hochberg et al. ............ 398/200 |
| 2008/0165565 A1 | 7/2008 | Gunter et al. |
| 2009/0022445 A1 | 1/2009 | Hochberg et al. |
| 2009/0067771 A1 | 3/2009 | Chen et al. |
| 2009/0123108 A1 | 5/2009 | Baehr-Jones et al. |
| 2009/0148095 A1 | 6/2009 | Pesetski et al. |
| 2010/0002994 A1 | 1/2010 | Baehr-Jones et al. |
| 2011/0170820 A1 | 7/2011 | Prather et al. |
| 2012/0039560 A1 | 2/2012 | Mazur et al. |

OTHER PUBLICATIONS

Forst, et al., "High-speed all-optical switching in ion-implanted silicon-on-insulator microring resonators", Optics Letters vol. 32, No. 14, Jul. 15, 2007, 2046-2048.

Geis, et al., "CMOS-Compatible All-Si High-Speed Waveguide Photodiodes With High Responsivity in Near-Infrared Communication Band", IEEE Photonics Technology Letters vol. 19, No. 3, Feb. 1, 2007, 152-153.

Jen, et al., "Exceptional electro-optic properties through molecular design and controlled self-assembly", Proceedings of SPIE vol. 5935, Aug. 2005, 593506-1-593506-13.

Lipson, , "Guiding, Modulating, and Emitting Light on Silicon—Challenges and Opportunities", Journal of Light wave Technology vol. 23, No. 12, Dec. 2005, 4222-4238.

Rahman, et al., "Polarization Crosstalk in High Index Contrast Planar Silica Waveguides", IEEE Photonics Technology Letters vol. 14, No. 8, Aug. 2002, 1109-1111.

Tazawa, et al., "Analysis of Ring Resonator-Based Traveling-Wave Modulators", IEEE Photonics Technology Letters vol. 18, No. 1, Jan. 1, 2006, 211-213.

Tazawa, et al., "Ring Resonator-Based Electrooptic Polymer Traveling-Wave Modulator", Journal of Light wave Technology vol. 24, No. 9, Sep. 2006, 3514-3519.

Witzens, et al., "Design of transmission line driven slot waveguide Mach-Zehnder interferometers and application to analog optical links", Optics Express vol. 18, No. 16, Aug. 2, 2010, 16902-16928.

Zhang, et al., "Low V Electrooptic Modulators from CLD-1: Chromophore Design and Synthesis, Material Processing, and Characterization", Chemistry of Materials vol. 13, May 2001, 3043-3050.

* cited by examiner

LOW-NOISE AND HIGH BANDWIDTH ELECTRIC FIELD SENSING WITH SILICON-POLYMER INTEGRATED PHOTONICS AND LOW DRIVE VOLTAGE MODULATOR FIBER-BASED ANTENNA LINK

CROSS-REFERENCE TO RELATED APPLICATIONS

This application claims priority to and the benefit of U.S. provisional patent application Low-Noise and High Bandwidth Electric Field Sensing with Silicon-Polymer Integrated Photonics, Ser. No. 61/145,447, filed Jan. 16, 2009, and provisional patent application Low Drive Voltage Modulator Fiber-Based Antenna Link, Ser. No. 61/145,438, filed Jan. 16, 2009, which applications are incorporated herein by reference in their entirety.

FIELD OF THE INVENTION

The invention relates to sensing electric fields in general and particularly to an electric field sensor that employs a low drive voltage modulator.

BACKGROUND OF THE INVENTION

Sensing of electric fields is important in many scientific fields. Some of the problems associated with remote sensing of electric fields are related to the physical size of the active sensor, sensitivity of the electric field sensor, and sensor system noise floors.

Another problem involves efficiently coupling received electromagnetic waves as RF signals to remote locations. Frequently, in vehicle and transportation applications, a RF antenna for a radio or RADAR system must be physically located away from the central set of electronics in an airplane, boat, or other vehicle. A coaxial cable is typically run from the antenna to the central processing location (e.g. a radio apparatus). The coaxial cable is heavy, and susceptible to electrostatic interference, and at relatively high frequencies, coaxial cables can cause substantial signal loss.

What is needed, therefore, is an improved electric field sensor having a smaller sensing area, higher sensitivity, and lower noise floor. Also, what is needed is a low noise system to communicatively couple to a remotely located antenna that is more immune to electromagnetic interference.

SUMMARY OF THE INVENTION

In one aspect, the invention relates to an optical low drive voltage modulator electric field sensor device that includes an electric field antenna. A low drive voltage modulator has an electrical voltage input electrically coupled to the electric field antenna, a light input, and a modulated light output. The optical low drive voltage modulator electric field sensor is configured to provide an optical output signal at the modulated light output having an optical parameter responsive to an electric field at the electric field antenna.

In one embodiment, the optical parameter is an intensity of the optical output signal.

In another embodiment, the low drive voltage modulator includes an integrated slot waveguide modulator.

In yet another embodiment, the low drive voltage modulator includes a Mach-Zehnder interferometer.

In yet another embodiment, the low drive voltage modulator has a drive voltage of about 0.25 V or less.

In yet another embodiment, the optical low drive voltage modulator electric field sensor device includes an electric field antenna. A low drive voltage modulator has an electrical voltage input that is electrically coupled to the electric field antenna, a light input, and a modulated light output. The optical low drive voltage modulator electric field sensor is configured to provide an optical output signal at the modulated light output having an optical parameter responsive to an electric field at the electric field antenna. The optical low drive voltage modulator electric field sensor device exists in combination with a laser optically that is coupled to the light input. A photodetector is optically coupled to the modulated light output via an optical fiber.

In yet another embodiment, an electric field sensor bandwidth is equal to or greater than 1 GHz.

In yet another embodiment, the electric field sensor system is configured for a non-contact sensing of an electric field.

In yet another embodiment, the non-contact sensing of an electric field includes a non-contact probing of RF transmission lines on a printed circuit board.

In yet another embodiment, the electric field sensor system is integrated onto a single substrate.

In yet another embodiment, the optical low drive voltage modulator electric field sensor device further includes a plurality of optical low drive voltage modulator electric field sensors.

In yet another embodiment, the plurality of optical low drive voltage modulator electric field sensors is integrated onto a single substrate.

In yet another embodiment, the electric field sensors are configured as neural sensors to receive mammalian neural signals.

In yet another embodiment, the electric field sensors are configured as elements of a phased array antenna.

In yet another embodiment, the electric field sensors are configured as elements of a multicore central processing unit architecture.

In yet another embodiment, the optical low drive voltage modulator electric field sensor device includes an electric field antenna. A low drive voltage modulator has an electrical voltage input that is electrically coupled to the electric field antenna, a light input, and a modulated light output, the optical low drive voltage modulator electric field sensor and is configured to provide an optical output signal at the modulated light output having an optical parameter responsive to an electric field at the electric field antenna. The optical low drive voltage modulator electric field sensor device exists in combination with a laser optically coupled to the light input via a first optical fiber. A photodetector is optically coupled to the modulated light output via a second optical fiber, the photodetector having an RF output terminal. The second optical fiber and the photodetector are configured to provide an RF output signal at the RF output terminal at a location physically remote from the antenna, and the RF output signal is responsive to an electromagnetic wave received at the antenna.

In yet another embodiment, the low drive voltage modulator includes an integrated slot waveguide modulator.

In yet another embodiment, the low drive voltage modulator includes a Mach-Zehnder interferometer.

In yet another embodiment, the optical low drive voltage modulator electric field sensor device includes an electric field antenna. A low drive voltage modulator has an electrical voltage input electrically coupled to the electric field antenna, a light input, and a modulated light output, the optical low drive voltage modulator electric field sensor and is configured to provide an optical output signal at the modulated light output having an optical parameter responsive to an electric field at the electric field antenna. The optical low drive voltage modulator electric field sensor device exists in combination with a laser optically coupled to the light input via a first optical fiber. A photodetector optically is coupled to the modulated light output via a second optical fiber, the photodetector having an RF output terminal. The second optical fiber and the photodetector are configured to provide an RF output signal at the RF output terminal at a location physically remote from the antenna, and the RF output signal is responsive to an electromagnetic wave received at the antenna. The optical low drive voltage modulator electric field sensor device further includes a second low drive voltage modulator that has an electrical voltage input that is electrically coupled to the electric field antenna, a light input, and a modulated light output. The light input of the second low drive voltage modulator is configured to receive light from the laser by way of a laser splitter input, the laser splitter having a first laser splitter output and a second laser splitter output. The first laser splitter output is optically coupled to the light input of the first low drive voltage modulator via a first optical fiber and the second laser splitter output to the light input of the second low drive voltage modulator via a second optical fiber. A photodetector splitter has a first photodetector splitter input, a second photodetector splitter input and a photodetector single output. The photodetector single output is optically coupled to a photodetector. The first photodetector splitter input is optically coupled to the modulated light output of the first low drive voltage modulator via a third optical fiber and the second photodetector splitter input optically coupled to the modulated light output of the second low drive voltage modulator via a fourth optical fiber, the photodetector having an RF output terminal.

In yet another embodiment, a selected one of the low drive voltage modulator and the second low drive voltage modulator includes an integrated slot waveguide modulator.

In yet another embodiment, a selected one of the low drive voltage modulator and the second low drive voltage modulator includes a Mach-Zehnder interferometer.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 10C is a diagram that shows a plot of modal patterns over four periods of a segmented waveguide on a horizontal plane that intersects the silicon layer halfway through.

DETAILED DESCRIPTION

Figure 1:
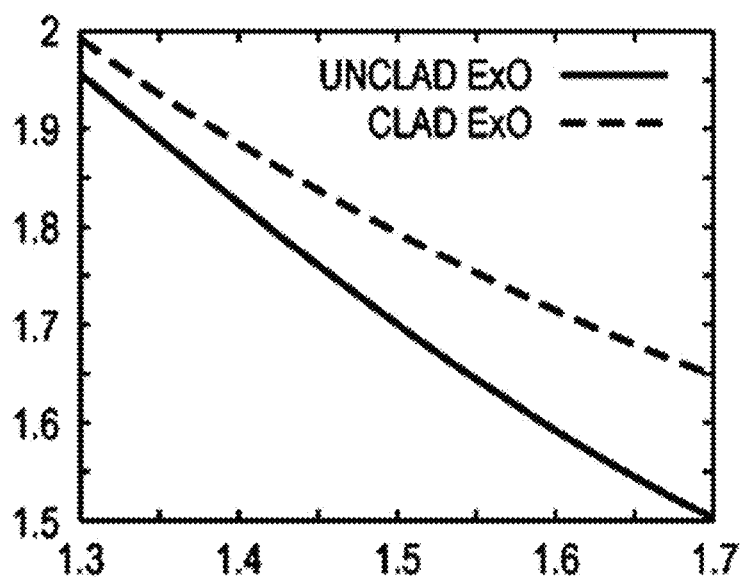
FIG. 1 is a diagram showing dispersion plots for the fundamental mode (Ex polarized) of exemplary clad and unclad waveguides, shown as effective index vs. wavelength in μm.

We describe hereinbelow both an electric field sensing device and a fiber-based antenna link. Both the electric field sensing device and the fiber-based antenna link are based on a low drive voltage modulator which can, for example, be fabricated in a silicon-polymer integrated photonics technology. We have previously described such a suitable low drive voltage modulator device in detail in U.S. patent application Ser. No. 12/626,561, ALL OPTICAL MODULATION AND SWITCHING WITH PATTERNED OPTICALLY ABSORBING POLYMERS, and in U.S. patent application Ser. No. 12/630,833, PHASE MATCHING FOR DIFFERENCE FREQUENCY GENERATION AND NONLINEAR OPTICAL CONVERSION FOR PLANAR WAVEGUIDES VIA VERTICAL COUPLING, both of which applications are incorporated herein by reference in their entirety for all purposes. We begin with a brief technology overview followed by a description of an exemplary low drive voltage modulator suitable for use in the inventive apparatus.

We now describe high index contrast waveguides that are useful to concentrate light in order to enhance nonlinear optical effects in various materials so that such effects can be employed to manipulate light (or more generally electromagnetic radiation) at low power levels, as compared to conventional systems and methods that employ nonlinear optical materials. The manipulation of electromagnetic radiation or light can be useful to provide a variety of components that perform operations on light such as rectification, modulation, filtering, and logic operations in a manner analogous to the same operations which are provided using electronic devices operating on electrical signals. For example, an input light wave to be processed is impressed onto the component. The light wave has at least one parameter characterizing the light wave, such as one of an intensity, a polarization, a frequency, a wavelength, and a duration (e.g., a pulse length, or in the case of continuous wave light, an effectively infinite duration). After the input light wave is processed (or interacts with the waveguide and the clad nonlinear optical material adjacent to the waveguide when present), an output signal is observed. In a circumstance where the input signal has been processed, the output signal has at least one parameter that is different from at least one parameter characterizing the input light wave, including possibly an electrical output signal when the input light wave had no electrical signal component (e.g., optical rectification).

We have developed a set of tools for concentrating light to a high degree by using silicon or other high index contrast waveguides, and we have fabricated devices that demonstrate some of the many applications that can be contemplated when such nonlinear materials are exploited. In particular, by utilizing split waveguides, we are able to greatly enhance the optical fields in the cladding of a tightly confined waveguide, without greatly enhancing the optical losses of the same waveguide. Combining the high field concentrations available from the split waveguides with the high nonlinear activity of nonlinear optical polymers permits the development of nonlinear optical devices operating at much lower optical input power levels than are possible with conventional free space or chip based systems. We have demonstrated four-wave mixing (which is based upon $\chi^3$), as well as optical rectification (based on $\chi^2$), in such waveguides. Using these waveguides it is possible to decrease the power levels needed to observe significant nonlinearities to the point where, by contrast with conventional nonlinear optics, it can be done with non-pulsed, continuous wave lasers.

Chi2 ($\chi^2$) and Chi3 ($\chi^3$) based optical effects can be used in particular to build on-chip optical parametric oscillator ("OPO") systems, where two input wavelengths can be mixed together to produce sum and difference frequencies. These frequencies can be either higher or lower than the input frequencies, and can be made tunable. These effects work for frequencies from the ultraviolet and X-ray regime all the way out into the far infrared and microwave, and in fact can work down to DC in some cases, particularly with optical rectification.

The material of which the high index waveguide is made can be any material having a high index that is reasonably transparent at the wavelengths of interest. This can include but is not limited to silicon, gallium nitride, indium phosphide, indium gallium nitride, gallium phosphide, diamond, sapphire, or the various quaternary III/V and II/VI materials such as aluminum gallium arsenide phosphide. III/V denotes materials having at least one element from column III of the periodic table of elements (or an element that is stable as a positive trivalent ion) and at least one element from column V (or an element that is stable as a negative trivalent ion). Examples of III/V compounds include BN, AlP, GaAs and InP. II/VI denotes materials having at least one element from column II of the periodic table of elements (or an element that is stable as a positive divalent ion) and at least one element from column VI (or an element that is stable as a negative divalent ion). Examples of II/VI compounds include MgO, CdS, ZnSe and HgTe.

We present successively the mechanical structure of exemplary embodiments of high index waveguides, exemplary embodiments of cladding materials having large nonlinear constants $\chi^2$ and $\chi^3$ and their incorporation into devices having high index waveguides, and some exemplary results observed on some of the fabricated devices that are described.

Exemplary High Index Waveguide Structures

High-Q Ring Resonators in Thin Silicon-on-Insulator

Resonators comprising high-Q microrings were fabricated from thin silicon-on-insulator (SOI) layers. Measured Q values of 45,000 were observed in these rings, which were then improved to 57,000 by adding a PMMA cladding. Various waveguide designs were calculated, and the waveguide losses were analyzed.

Microring resonator structures as laser sources and as optical filter elements for dense wavelength division multiplexing systems have been studied in the past. The silicon-on-insulator (SOI) structure described here is particularly advantageous. It has low waveguide loss. One can extrapolate an uncoupled Q value of 94,000 and a waveguide loss of 7.1 dB/cm in the unclad case, and −6.6 dB/cm in the PMMA clad case, from the respective measured Q values of 45,000 and 57,000. Although higher Q values have been obtained for optical microcavities, we believe that our geometry has the highest Q for a resonator based on a single mode silicon waveguide. It is also noteworthy that a large amount of power appears outside the core silicon waveguide, which may be important in some applications. The modes that are described herein have approximately 57% of the power outside the waveguide, as compared to 20% for a single-mode 200-nm-thick silicon waveguide, and 10% for a single-mode 300-nm-thick silicon waveguide.

In one embodiment, wafer geometries were selected that minimize the thickness of the SOI waveguiding layer as well as the buried oxide, but still yield low loss waveguides and bends. A number of different waveguide widths were compared by finite difference based mode solving. The geometry used in the exemplary embodiment comprises a 500-nm-wide waveguide formed in a 120-nm-thick silicon layer, atop a 1.4 μm oxide layer, which rests on a silicon handle, such as a silicon wafer as a substrate. Such a configuration supports only a single well-contained optical mode for near infrared wavelengths. The dispersion characteristics are shown in FIG. 1 for both unclad and PMMA-clad waveguides. Our interest in unclad structures stems from the ease of fabrication, as detailed in the following, as well as the flexibility an open air waveguide may provide for certain applications.

These modes were determined by using a finite difference based Hermitian eigensolver. It is possible to calculate the loss directly from the mode pattern with an analytic method valid in the low-loss limit. The waveguide loss at 1.55 μm calculated in such a fashion is approximately −4.5 dB. This loss figure was in agreement with the extrapolated results of FDTD simulation.

Because a loss of −4 dB/cm is attributed to substrate leakage, the waveguide loss can be improved by the addition of a cladding, which tends to pull the mode upwards. This notion is supported by the measured decrease in waveguide loss upon the addition of a PMMA cladding. It can be shown that the substrate leakage loss attenuation coefficient is nearly proportional to $$e^{-2\sqrt{n_{eff}^2 - n_o^2 k_0 A}}$$

if $k_0$ is the free space wave number, $n_{eff}$ is the effective index of the mode, $n_o$ is the effective index of the oxide layer, and A is the thickness of the oxide. In the present case, the e-folding depth of the above-mentioned function turns out to be 180 nm, which explains why the substrate leakage is so high.

SOI material with a top silicon layer of approximately 120 nm and 1.4 μm bottom oxide was obtained in the form of 200 mm wafers, which were manually cleaved, and dehydrated for 5 min at 180° C. The wafers were then cleaned with a spin/rinse process in acetone and isopropanol, and air dried. HSQ electron beam resist from Dow Corning Corporation was spin coated at 1000 rpm and baked for 4 min at 180° C. The coated samples were exposed with a Leica EBPG-5000+ electron beam writer at 100 kV. The devices were exposed at a dose of 4000 μc/cm², and the samples were developed in MIF-300 TMAH developer and rinsed with water and isopropanol. The patterned SOI devices were subsequently etched by using an Oxford Plasmalab 100 ICP-RIE within 12 mTorr of chlorine, with 800 W of ICP power and 50 W of forward power applied for 33 s. Microfabricated devices such as the one shown in FIG. 2 were tested by mounting the dies onto an optical stage system with a single-mode optical fiber array. A tunable laser was used first to align each device, and then swept in order to determine the frequency domain behavior of each of the devices. Light was coupled into the waveguides from a fiber mode by the use of grating couplers. Subsequently the devices were spin-coated with 11% 950 K PMMA in Anisole, at 2000 rpm, baked for 20 min at 180° C. and retested.

The theoretical development of the expected behavior of a ring resonator system has been described in the technical literature. In the present case the dispersion of the waveguide compels the addition of a dispersive term to the peak width. We take $\lambda_0$ to be the free space wavelength of a resonance frequency of the system, $n_0$ to be the index of refraction at this wavelength. $(\delta n/\delta \lambda)_0$, the derivative of n with respect to λ taken at $\lambda_0$, L to be the optical path length around the ring, α to be the optical amplitude attenuation factor due to loss in a single trip around the ring, and finally t to be the optical amplitude attenuation factor due to traveling past the coupling region. In the limit of a high Q, and thus $(1-\alpha) \ll 1$ and $(1-t) \ll 1$, we have $$Q = (\pi L/\lambda_0)[n_0 - \lambda_0(\delta n/\delta \lambda)_0]/(1-\alpha t) \quad (1)$$

Figure 2:
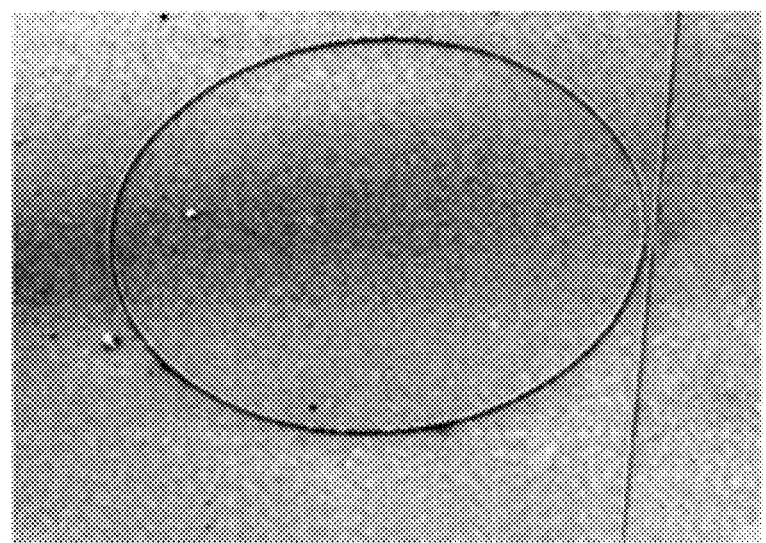
FIG. 2 is a diagram showing an SEM image of an exemplary ring resonator.
Figure 3:
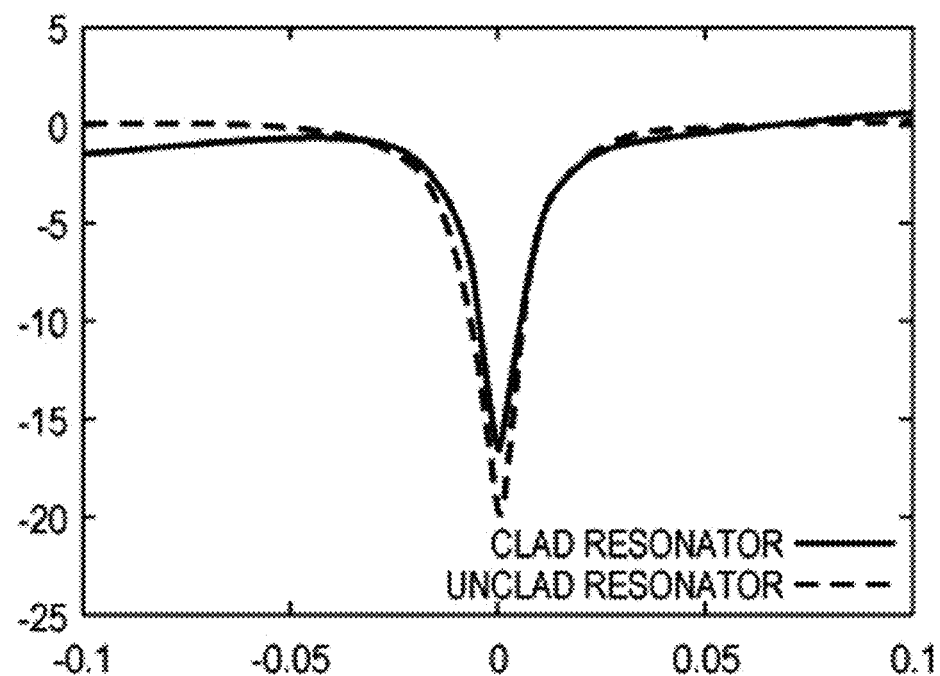
FIG. 3 is a diagram showing the normalized transmission of light through the system (and past the ring) in dB, as a function of wavelength detuning in nm for both clad and unclad waveguides, shifted to overlay resonance peaks.

The waveguide mode was coupled into a ring resonator from an adjacent waveguide. As shown in FIG. 2, the adjacent waveguide can in some embodiments be a linear waveguide. The strength of coupling can then be lithographically controlled by adjusting the distance between the waveguide and the ring. This ring was fabricated with a radius of 30 μm, a waveguide width of 500 nm, and a separation between ring and waveguide of 330 nm. For the clad ring presented, the measured Q is 45,000, and the extinction ratio is −22 dB, for the resonance peak at 1512.56 nm. The PMMA clad ring had a similar geometry, and achieved a Q of 57,000, but with an extinction ratio of −15.5 dB. Typical observed transmission spectra are shown in FIG. 3. The typical amount of optical power in the waveguide directly coupling into the resonator was about 0.03 mW. A dependence of the spectrum on this power was not observed, to within an order of magnitude.

From the mode-solving results for the unclad waveguides, we have $(\delta n/\delta \lambda)(1.512) = -1.182$ μm$^{-1}$, and $n(\lambda=1.512) = 1.688$. Using this result and the earlier relations, the waveguide loss can be calculated from the measured Q value. Specifically, an extinction that is at least −22 dB indicates that a critically coupled Q in this geometry is greater than 38,500, which then implies a waveguide loss of less than −7.1 dB/cm. In similar fashion, the PMMA clad waveguide resonator with a Q of 57,000 but only −15.5 dB of extinction allows a worst case waveguide loss of −6.6 dB/cm. This also implies an intrinsic Q of 77,000 for the unclad resonator, and an intrinsic Q of 94,000 for the PMMA clad resonator.

These devices have a slight temperature dependence. Specifically, the resonance peak shifts correspondingly with the change in the refractive index of silicon with temperature, moving over 2 nm as temperature shifts from 18 to 65° C. The Q rises with higher temperatures slightly, from 33 k at 18° C. to 37 k on one device studied. This shift can probably be explained entirely by the dependence of Q on the effective index.

High-Q Optical Resonators in Silicon-On-Insulator Based Slot Waveguides

We now describe the design, fabrication and characterization of high Q oval resonators based on slot waveguide geometries in thin silicon on insulator material. Optical quality factors of up to 27.000 were measured in such filters, and we estimate losses of −10 dB/cm in the slotted waveguides on the basis of our resonator measurements. Such waveguides enable the concentration of light to very high optical fields within nano-scale dimensions, and show promise for the confinement of light in low-index material with potential applications for optical modulation, nonlinear optics and optical sensing. As will be appreciated, the precise geometry of a resonator (or other kinds of devices) is frequently a matter of design, and the geometry can be varied based on such considerations as length of waveguide, area of a chip, and required interaction (or required non-interaction), such as coupling (or avoiding coupling) with other waveguide structures that are present in a device or on a chip. In some embodiments, the waveguide can be a closed loop, such as at least one ring or at least one oval shaped endless stripe. As has been explained, optical energy can be provided to such a closed loop, for example with an input waveguide.

One can form high quality factor ring or oval resonators in SOI. In these SOI waveguides, vertical confinement of light is obtained from the index contrast between the silicon core and the low index cladding (or air) and the buried silicon dioxide layer, whereas lateral confinement can be obtained by lithographically patterning the silicon. The majority of the light tends to be guided within the silicon core in such waveguide. Although the high refractive index contrast between silicon and its oxide provide excellent optical confinement, guiding within the silicon core can be problematic for some applications. In particular, at very high optical intensities, two-photon absorption in the silicon may lead to high optical losses. Moreover, it is often desirable to maximize the field intensity overlap between the optical waveguide mode and a lower index cladding material when that cladding is optically active and provides electro-optic modulation or chemical sensing.

One solution to these problems involves using a slot waveguide geometry. In a slot waveguide, two silicon stripes are formed by etching an SOI slab, and are separated by a small distance. In one embodiment, the separation is approximately 60 nm. The optical mode in such a structure tends to propagate mainly within the center of the waveguide. In the case of primarily horizontal polarization, the discontinuity condition at the cladding-silicon interface leads to a large concentration of the optical field in the slot or trench between the two stripes. One can predict that the electric field intensity would be approximately $10 \sqrt{P}$ V/m where P is the input power in watts. One design uses a 120 nm silicon on insulator layer and 300 nm wide silicon strips on top of a 1.4 μm thick buried oxide layer, which is in turn deposited on a silicon substrate. Various widths for the central slot were fabricated to provide test devices with 50, 60 and 70 nm gaps. Slots larger than 70 nm have also been fabricated and were shown to work well.

In the 1.4-1.6 μm wavelength regime, the waveguide geometry is single mode, and a well-contained optical mode is supported between the two silicon waveguide slabs. There is some loss that such an optical mode will experience even in the absence of any scattering loss or material absorption due to leakage of light into the silicon substrate. The substrate loss can be estimated semi-analytically via perturbation theory, and ranges from approximately −0.15 dB/cm at 1.49 μm to about −0.6 dB/cm at 1.55 μm for the SOI wafer geometry of the present embodiment.

Figure 4:
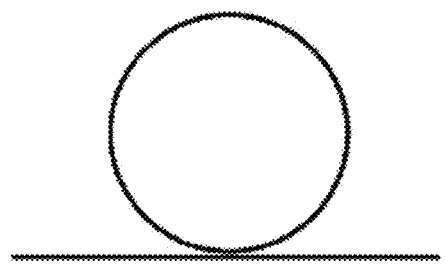
FIG. 4 is a diagram showing the device layout of an exemplary slot waveguide.

Oval resonators were fabricated by patterning the slot waveguides into an oval shape. An oval resonator geometry was selected in preference to the more conventional circular shape to enable a longer coupling distance between the oval and the external coupling waveguide or input waveguide. See FIG. 4. Slots were introduced into both the oval and external coupling waveguides.

Predicting coupling strength and waveguide losses for such devices is not easy. Many different coupling lengths and ring to input waveguide separations were fabricated and tested. It is well known that the most distinct resonance behavior would be observed for critically coupled resonators, in which the coupling strength roughly matches the round trip loss in the ring.

An analytic expression for the quality factor of a ring resonator was presented in equation (1) hereinabove.

Also, the free spectral range can be calculated via:

$$\Delta\lambda = (\lambda_0/L)/[1/L + n_0/\lambda_0 - (\delta n/\delta\lambda)_0] \quad (2)$$

Here, L is the round trip length in the ring, and $n_0$ and $\lambda_0$ are the index of refraction, and the wavelength at resonance, respectively. The derivative of the effective index with respect to the wavelength at the resonance peak is given by $(\delta n/\delta\lambda)_0$, and it can be shown that this term is roughly equal to −0.6 $\mu m^{-1}$ from the 1.4-1.6 μm spectral range for the slot waveguides studied here.

Figure 5:
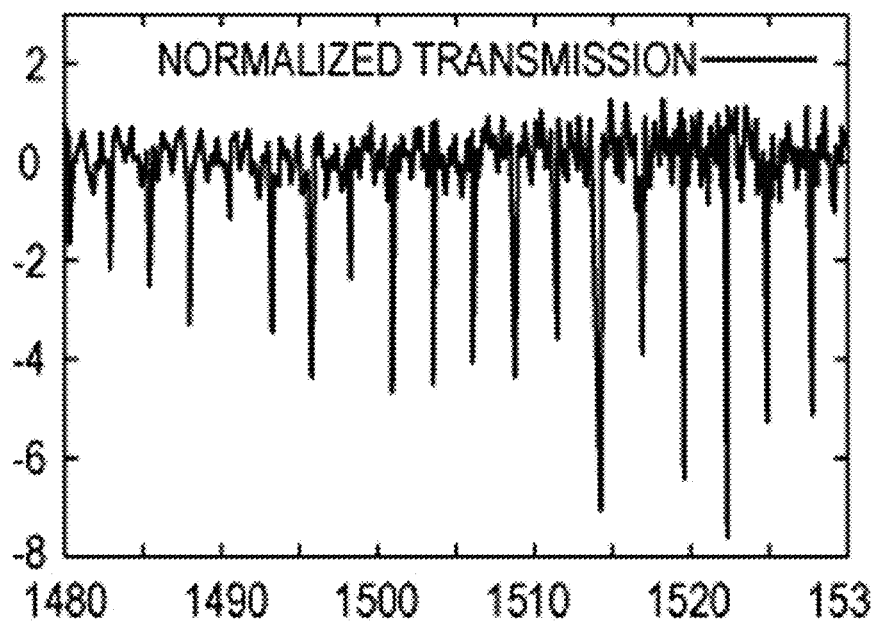
FIG. 5 is a diagram showing the measured transmission spectrum in dB vs. laser wavelength in nm past a high quality factor slot ring resonator.
Figure 6:
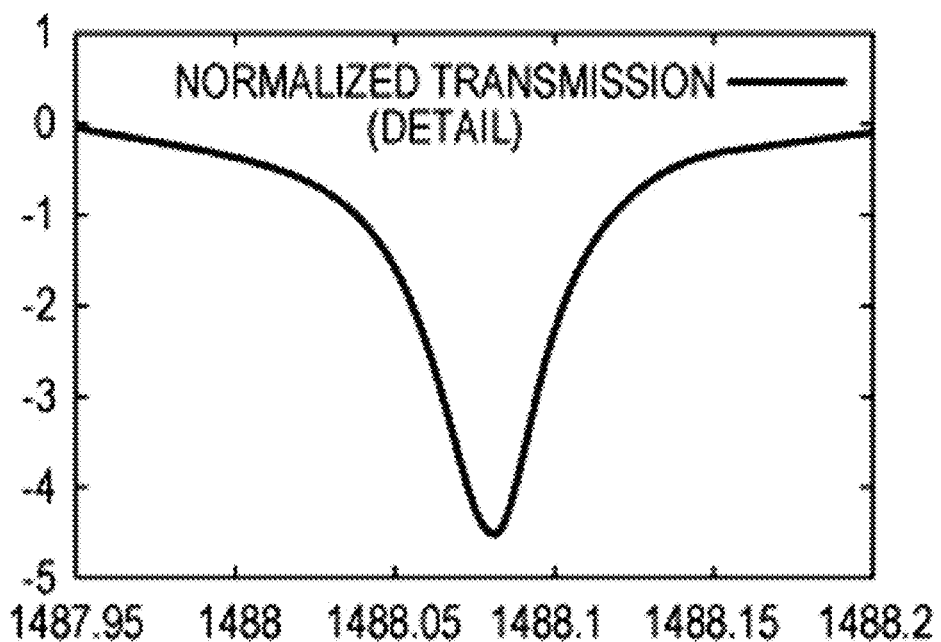
FIG. 6 is a diagram showing the detail of the peak of the transmission spectrum near 1488 nm.

We have observed a quality factor of 27,000 in a device fabricated with a slot size of 70 nm, a ring to input waveguide edge to edge separation of 650 nm, and a coupling distance of 1.6 μm. The radius of the circular part of the slotted oval was 50 μm. This resonance was observed near 1488 nm, and the resonance peak had an extinction ratio of 4.5 dB. FIG. 5 shows the measured transmission spectrum past the ring, normalized for the input coupler baseline efficiency of our test system. FIG. 6 shows the details of one peak in the vicinity of 1488 nm. Because the extinction ratio at the resonance peak was not very large in this case, it was not possible to accurately determine waveguide losses from this device. By measuring many devices with different geometries, we obtained data on resonators with higher extinction ratios that approached critical coupling. One such device was a 50 μm radius slotted ring resonator with a 60 nm waveguide gap, a ring to input waveguide spacing of 550 nm and coupling length of 1.6 μm. In this device, a Q of 23,400 was observed near 1523 nm, with an on-resonance extinction of 14.7 dB.

Since this resonance is nearly critically coupled, the waveguide loss can be estimated using equation (1) as −10 dB/cm. We can also use equation (2) to further validate our theoretical picture of the ring resonator. The observed free spectral range of this resonator was 2.74 nm, while equation (2) predicts 2.9 nm. This discrepancy is most likely due to small differences in the fabricated dimensions as compared to those for which the numerical solutions were obtained.

To further validate the waveguide loss result, several waveguide loss calibration loops were fabricated with varying lengths of the slot waveguide, ranging from 200 to 8200 um in length. A total of five center slot waveguide devices were studied for each of the 50, 60 and 70 nm slot widths. Linear regression analysis on the peak transmission of each series yielded waveguide loss figures of 11.6±3.5 dB/cm for the 50 nm center waveguide, 7.7±2.3 dB/cm for the 60 nm center waveguide, and 8.1±1.1 dB/cm for the 70 nm center waveguide. These figures are in agreement with the loss estimated from the oval resonator. Since the theoretical loss due to substrate leakage is much lower than this, it is clear that a great deal of loss is due to surface roughness and possibly material absorption. It is believed that engineering improvements will decrease this loss further. For sensing and modulation applications as well as use in nonlinear optics, the high optical field concentration that can be supported in the cladding material of the slotted waveguide geometry should be very advantageous when compared to more conventional waveguides.

Figure 7:
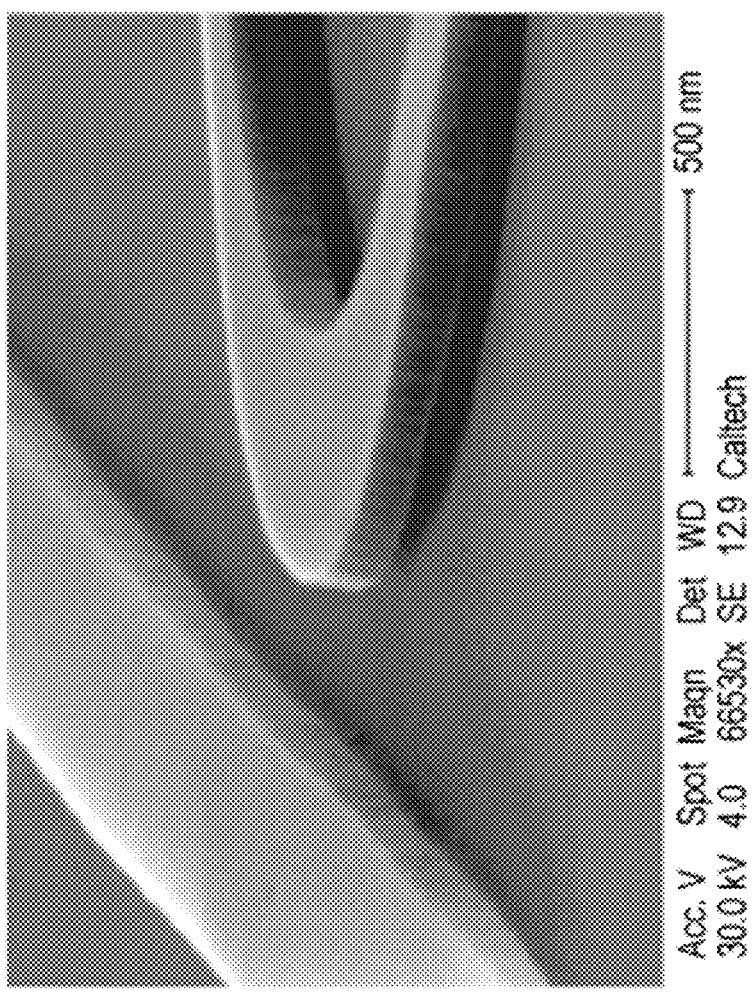
FIG. 7 is a diagram showing a shallow angle SEM view of a typical silicon-on-insulator ring resonator and waveguide having a sidewall roughness on the order of 10 nm.
Figure 8:
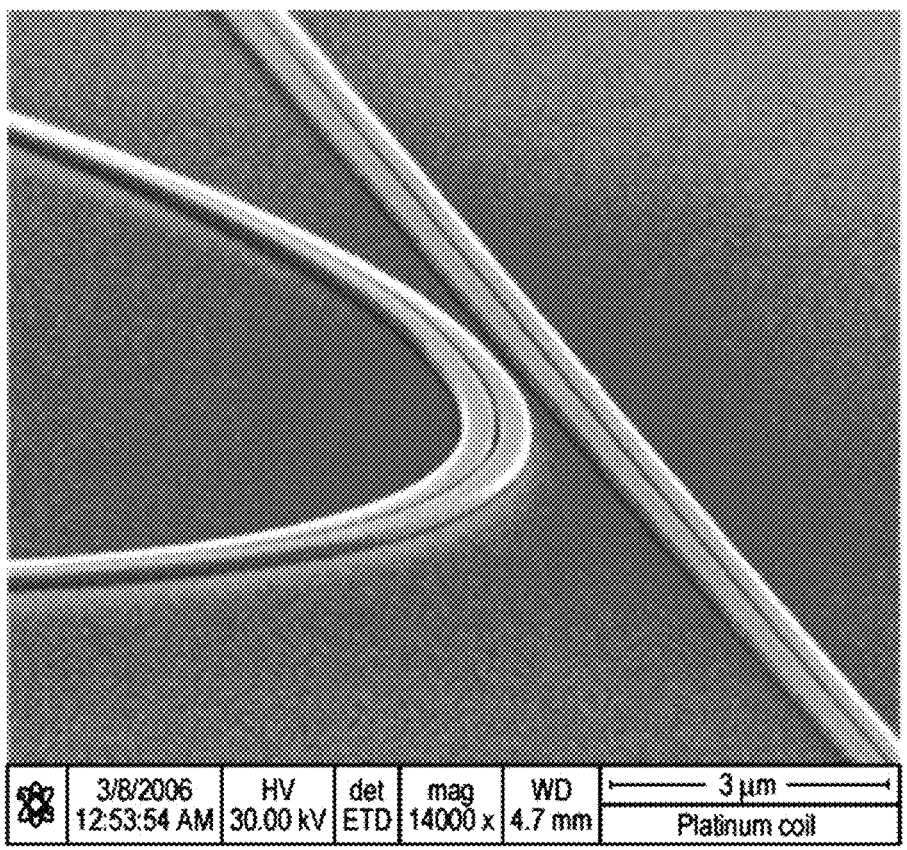
FIG. 8 is a diagram of a slot ring resonator directional coupler region, and the associated input waveguide.

FIG. 7 is a diagram showing a shallow angle SEM view of a silicon-on-insulator ring resonator and waveguide having a sidewall roughness on the order of 10 nm. In the exemplary waveguide shown in FIG. 7, the silicon-insulator bond has been decorated with a brief buffered oxide etch. FIG. 8 is a diagram of a slot ring resonator directional coupler region, and the associated input waveguide.

Figure 9:
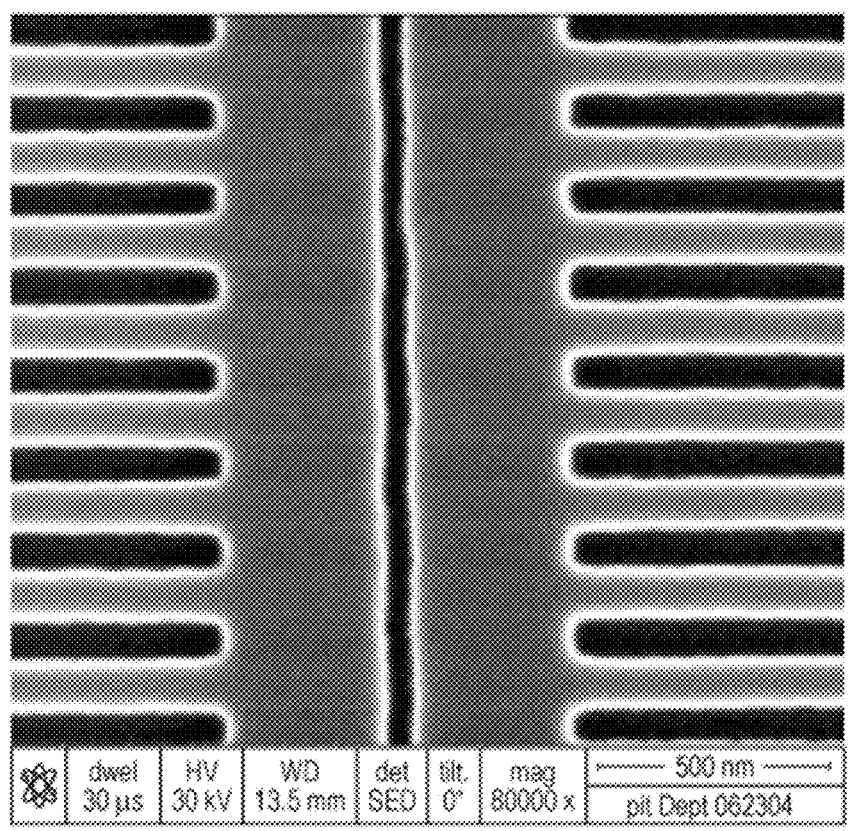
FIG. 9 is a diagram showing an exemplary high-index segmented waveguide structures, which in the embodiment shown comprises a central waveguide portion with fingers or ridges sticking out to the sides.

Other variations on the geometry of waveguides are possible. FIG. 9 is a diagram showing an exemplary high-index segmented waveguide structures, which in the embodiment shown comprises a central waveguide portion with fingers or ridges sticking out to the sides. With the light localized in the center in a Bloch mode, electrical contact can be established using the fingers or ridges that stick off the sides of the waveguide. This structure provides a way to form both electrical contacts to waveguides and structures that would provide electrical isolation with low optical loss. Through an iterative process involving a combination of optical design using a Hermetian Bloch mode eigensolver and fabrication of actual structures, it was found that (non-slotted) segmented waveguide structures could be constructed in 120 nm thick SOI. Waveguide losses as small as −16 dB per centimeter were observed, and insertion losses as small as −0.16 dB were shown from standard silicon waveguides.

Figure 10A:
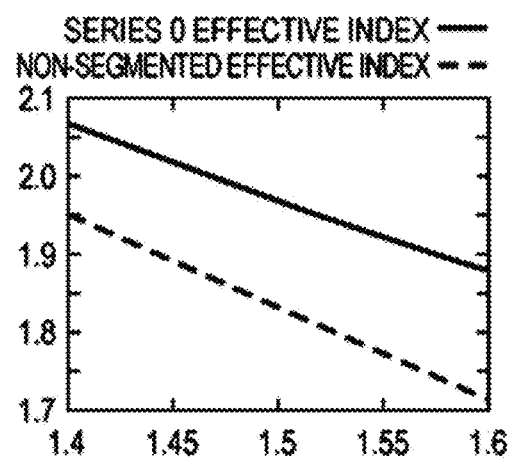
FIG. 10A is a diagram that shows a dispersion diagram of both a segmented waveguide and the normal, unsegmented waveguide, taken on a plane parallel to the substrate that on a z plane intersects the middle of a segment.
Figure 10B:
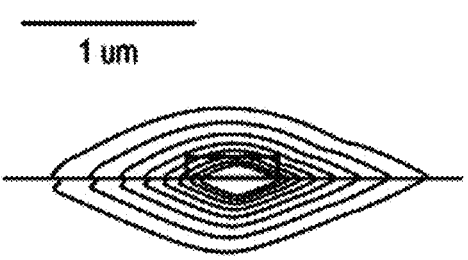
FIG. 10B is a diagram that shows modal patterns of the Bloch mode, with contours of |E| starting at 10% of the max value and with contour increments of 10%.
Figure 10C:
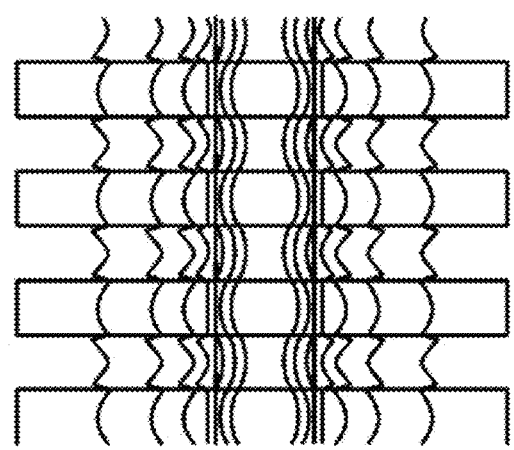

The segmented waveguide structure can also be modeled as regards its expected properties, which can then be compared to actual results. FIG. 10A is a diagram that shows a dispersion diagram of both a segmented waveguide and the normal, unsegmented waveguide, taken on a plane parallel to the substrate that on a z plane that intersects the middle of a segment. FIG. 10B is a diagram that shows modal patterns of the Bloch mode, with contours of |E| plotted, starting at 10% of the max value and with contour increments of 10%. FIG. 10C is a diagram that shows a plot of modal patterns over four periods of a segmented waveguide on a horizontal plane that intersects the silicon layer halfway through.

Figure 11:
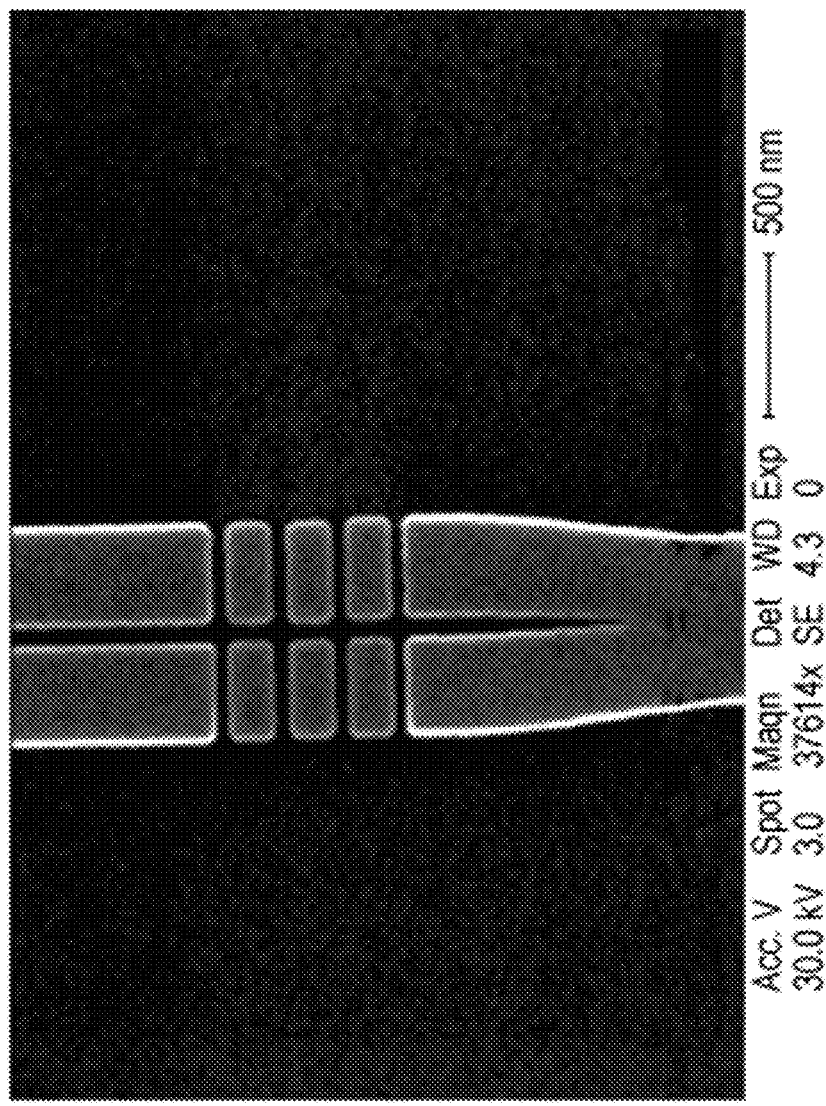
FIG. 11 is a diagram that shows an exemplary electrical isolator that was constructed and tested, and which provided both a transition from a standard to a slotted waveguide and electrical isolation between the two sides of the slot waveguide.

By utilizing the same type of design methodology as was used for the segmented waveguides, one is able to able to construct structures that provide electrical isolation without substantial optical loss. FIG. 11 is a diagram that shows an exemplary electrical isolator that was constructed and tested, and which provided both a transition from a standard to a slotted waveguide and electrical isolation between the two sides of the slot waveguide. Such structures were shown to have losses on the order of 0.5 dB.

Optical Modulation and Detection in Slotted Silicon Waveguides

In this example, we describe a system and process that provide low power optical detection and modulation in a slotted waveguide geometry filled with nonlinear electro-optic polymers and present examples that demonstrate such methods. The nanoscale confinement of the optical mode, combined with its close proximity to electrical contacts, enables the direct conversion of optical energy to electrical energy, without external bias, via optical rectification, and also enhances electro-optic modulation. We demonstrate this process for power levels in the sub-milliwatt regime, as compared to the kilowatt regime in which optical nonlinear effects are typically observed at short length scales. The results presented show that a new class of detectors based on nonlinear optics can be fabricated and operated.

Waveguide-based integrated optics in silicon provide systems and methods for concentrating and guiding light at the nanoscale. The high index contrast between silicon and common cladding materials enables extremely compact waveguides with very high mode field concentrations, and allows the use of established CMOS fabrication techniques to define photonic integrated circuits. By using slotted waveguides, it is possible to further concentrate a large fraction of the guided mode into a gap within the center of a silicon waveguide. This geometry greatly magnifies the electric field associated with the optical mode, resulting in electric fields of at least (or in excess of) $10^6$ V/m for continuous-wave, sub-milliwatt optical signals. Moreover, since the slotted geometry comprises two silicon strips which can be electrically isolated, a convenient mechanism for electro-optic interaction is provided. Such waveguides can be fabricated with low loss. We have previously described systems that provide losses below −10 dB/cm.

In the present example, we exploit both the high intensity of the optical field and the close proximity of the electrodes for several purposes. First, we demonstrate detection of optical signals via direct conversion to electrical energy by means of nonlinear optical rectification. An exemplary device comprises a ring resonator with an electro-optic polymer based $\chi^2$ material deposited as a cladding. Inside the slot, the high optical field intensity creates a standing DC field, which creates a virtual voltage source between the two silicon electrodes, resulting in a measurable current flow, in the absence of any external electrical bias. Though optical rectification has been observed in electro-optic polymers, typically instantaneous optical powers on the order of 1 kW are needed for observable conversion efficiencies, often achieved with pulsed lasers. The exemplary embodiment provides measurable conversion with less than 1 mW of non-pulsed input, obtained from a standard, low power tunable laser operating near 1500 nm.

In one embodiment, systems and methods of the invention provide standard Pockels' effect based modulation, which is similarly enhanced by means of the very small scale of our device. The close proximity of the electrodes, and ready overlap with the optical mode, causes an external voltage to produce a far larger effective electric modulation field, and therefore refractive index shift, than would be obtained through conventional waveguide designs. In one embodiment, the modulation and refractive index shift is provided by tuning the resonance frequencies of a slot waveguide ring resonator.

Device Fabrication

Waveguide Fabrication

The devices described in this example were fabricated in electronic grade silicon-on-insulator (SOI) with a top layer thickness of 1110 nm and an oxide thickness of 1.3 microns. The silicon layer is subsequently doped to approximately $10^{19}$ Phosphorous atoms/cm$^3$, yielding resistivities after dopant activation of about 0.025 ohm-cm. Electro-optic ("EO") polymers were then spin-deposited onto the waveguide structures and subsequently poled by using a high field applied across the slot in the waveguide.

Lithography was performed using a Leica EBPG 5000+ electron beam system at 100 kv. Prior to lithography, the samples were manually cleaved, cleaned in acetone and iso-propanol, baked for 20 minutes at 180 C, coated with 2 percent HSQ resist from Dow Corning Corporation, spun for two minutes at 1000 rpm, and baked for an additional 20 minutes. The samples were exposed at 5 nm step size, at 3500 μC/cm$^2$. The samples were developed in AZ 300 TIMAH developer for 3 minutes, and etched on an Oxford Instruments PLC Plasmalab 100 with chlorine at 80 sccm, forward power at 50 W, ICP power at 800 W, 12 mTorr pressure, and 33 seconds of etch time. The samples were then implanted with phosphorous at normal incidence, 30 keV energy, and $1\times10^{14}$ ions/cm$^2$ density. The sample was annealed under a vacuum at 950 C in a Jipilec Jetstar rapid thermal annealer. The samples were dipped in buffered hydrofluoric acid in order to remove the remnants of electron beam resist from the surface.

After initial optical testing, the samples were coated with YLD 124 electro-optic polymer, and in one case with dendrimer-based electro-optic material. The samples were stored under a vacuum at all times when they were not being tested, in order to reduce the chances of any degradation.

Measurement Results

Optical Rectification Based Detection

Figure 12:
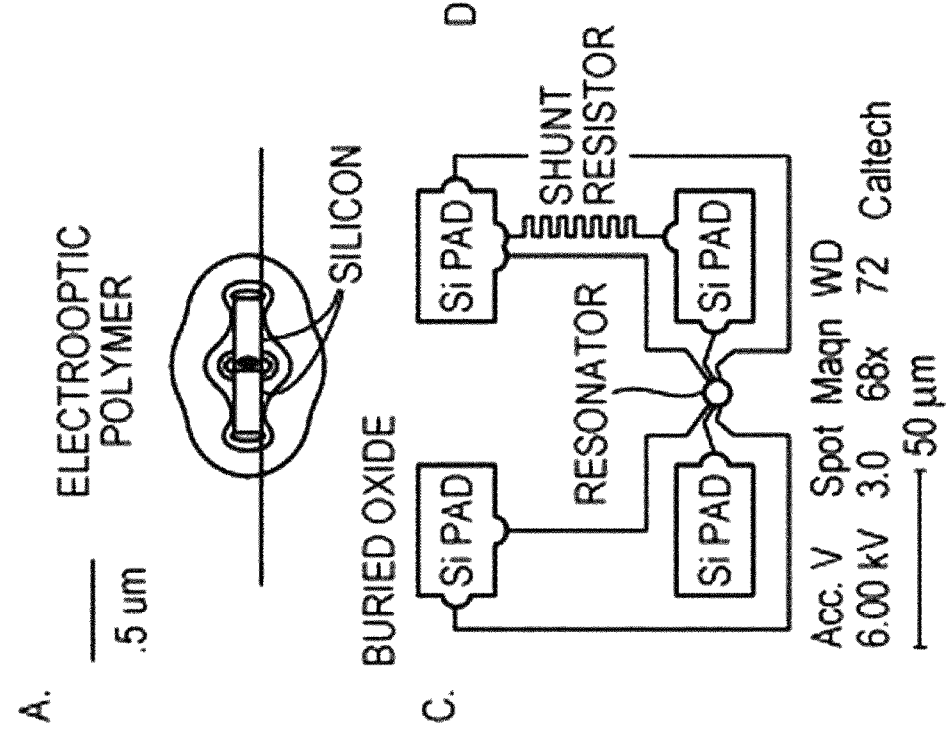
FIG. 12 is a four panel diagram that shows details of one embodiment of an optical modulator device, including the geometry of the photodetectors and filters, and including a cross section of the slotted waveguide.

FIG. 12 is a four panel diagram that shows details of one embodiment of an optical modulator device, including the geometry of the photodetectors and filters, and including a cross section of the slotted waveguide. Panel A of FIG. 12 shows a cross section of the device geometry with optical mode superimposed on a waveguide. In FIG. 12A, the optical mode was solved using a finite-difference based Hermetian Eigensolver, such as that described by A. Taflove, *Computational Electrodynamics*, (Artech House, Boston, Mass., 1995), and has an effective index of approximately 1.85 at 1500 nm. Most of the electric field is parallel to the plane of the chip, and it is possible to contact both sides of the slot in a slotted ring resonator, as shown in FIG. 12B, which shows a SEM image of the resonator electrical contacts. Electrically isolated contacts between the silicon rails defining the slotted waveguide introduce only about 0.1 dB of optical loss. FIG. 12C shows the logical layout of device, superimposed on a SEM image of a device. FIG. 12C details the layout of a complete slotted ring resonator, with two contact pads connected to the outer half of the ring, and two pads electrically connected to the inner half of the ring. A shunt resistor provides a means of confirming electrical contact, and typical pad-to-pad and pad-to-ring resistances range from 1 MΩ to 5 MΩ. FIG. 12D displays a typical electrically contacted slotted ring as presently described. FIG. 12D is an image of the ring and the electrical contact structures.

Measurements were performed with single-mode polarization maintaining input and output fibers, grating coupled to slotted waveguides with an insertion loss of approximately 8 dB. Optical signal was provided from an Agilent 81680A tunable laser and in some cases an erbium doped fiber amplifier ("EDFA") from Keopsys Corporation. A continuous optical signal inserted into a poled polymer ring results in a measurable current established between the two pads, which are electrically connected through a pico-Ammeter. In the most sensitive device, a DC current of ~1.3 nA was observed, indicating an electrical output power of ~$10^9$ of the optical input power ($5 \times 10^{-12}$ W of output for approximately 0.5 mW coupled into the chip). Control devices, in which PMMA or un-poled EO material was substituted, show no photocurrent.

The fact that there is no external bias (or indeed any energy source) other than the optical signal applied to the system of this embodiment demonstrates conclusively that power is being converted from the optical signal. To establish that the conversion mechanism is actually optical rectification, we performed a number of additional measurements. A steady bias was applied to the chip for several minutes, as shown in Table IA. A substantial change in the photoresponse of the device was observed. This change depends on the polarity of the bias voltage, consistent with the expected influence of repoling of the device in-place at room temperature. Specifically, if the external bias was applied opposing the original poling direction, conversion efficiency generally decreased, while an external bias in the direction of the original poling field increased conversion efficiency.

TABLE 1

Polling Results
Part A:

| Action | New Steady State Current (6 dBm input) |
|---|---|
| Initial State | −5.7 pA |
| +10 V for 2 minutes | 0 pA |
| −10 V for 2 minutes | −7.1 pA |
| +10 V for 2 minutes | −4.4 pA |
| +10 V for 4 minutes | −6.1 pA |
| −10 V for 4 minutes | −4.5 pA |
| −10 V for 2 minutes | −14.8 pA |

Part B:

| Device | Action | Current Polarity of Optical Rectification |
|---|---|---|
| 1 | Positive Poling | Positive |
| 1 | Thermal Cycling to poling temperature with no_voltage | Rapid fluctuation, did not settle |
| 1 | Negative Poling | Negative |
| 2 | Negative Poling | Negative |
| 2 | Thermal Cycling to Poling temperature with no voltage | None observable |
| 2 | Positive Poling | Negative |
| 3 | Negative Poling | Negative |
| 4 | Positive Poling | Positive |
| 5 | Negative Poling | Negative |

To further understand the photo-conversion mechanism, 5 EO detection devices were poled with both positive and negative polarities, thus reversing the direction of the relative $\chi^2$ tensors. For these materials, the direction of $\chi^2$ is known to align with the polling E field direction, and we have verified this through Pockels' effect measurements. In all but one case, we observe that the polarity of the generated potential is the same as that used in poling, and the +V terminal during poling acts as the −V terminal in spontaneous current generation, as shown in Table IB. Furthermore, the polarity of the current is consistent with a virtual voltage source induced through optical rectification. It was observed that these devices decay significantly over the course of testing, and that in one case the polarity of the output current was even observed to spontaneously switch after extensive testing. However, the initial behavior of the devices after poling seems largely correlated to the $\chi^2$ direction.

Part A of Table 1 shows the dependence of the steady state observed current after room temperature biasing with various voltage polarities for one device. The device was originally polled with a ~12 V bias, though at 110 C. With one exception, applying a voltage in the direction of the original polling voltage enhances current conversion efficiencies, while applying a voltage against the direction of the polling voltage reduces the current conversion efficiencies. It should be noted that the power coupled on-chip in these measurements was less than 1 mW due to coupler loss.

Part B of Table 1 shows the behavior of several different devices immediately after thermal polling or cycling without voltage. Measurements were taken sequentially from top to bottom for a given device. The only anomaly is the third measurement on device 2; this was after significant testing, and the current observed was substantially less than was observed in previous tests on the same device. We suspect that the polymer was degraded by repeated testing in this case.

Analysis of Data for Optical Rectification

To derive the magnitude of the expected photocurrent, we assume that the $\chi^2$ magnitude relating to the Pockels' effect is similar to that for optical rectification. A measurement of $\chi^2$ can then be obtained from the direct observation of the electro-optic coefficient by the standard measurements described earlier. The typical measured tuning value of 2 GHz/V yields approximately 50 pm/V.

In the best case, devices with 6 dBm of input power returned approximately 1.4 nA of current. With Qs ranging from 3 k to 5 k, and assuming approximately 7 dB of insertion loss in the input grating coupler on one of our chips, in the best case as much as 0 dBm might be circulating in a resonator on resonance. This implies a peak electric field due to the optical signal of approximately $3.1 \times 10^6$ V/m. The induced static nonlinear polarization field is then nearly 1000 V/m, which amounts to a voltage drop of $14 \times 10^{-5}$ V across a 140 nm gap. If this voltage is assumed to be perfectly maintained, and the load resistance is assumed to be 5 MΩ, then 28 pA would be generated, about a factor of 100 less than is observed in the largest measurement made, but within a factor of 20 of the typical measurement of 352 pA for 6 dBm of input. Significantly, because the generated current is quadratic in E, it is clear that the current will be linearly proportional to the input intensity. This is in accordance with our observations. The best results for optical rectification were obtained with YLD 124/APC polymer, whereas our best Pockels' Effect results were obtained with the dendrimer materials.

Significantly, the sign of the output current matches that which would be predicted by nonlinear optical rectification, as discussed above. Specifically, since positive current emanates from the positive terminal, the rectified E field has a sign reversed from the $\chi^2$ and the polling E field. It is well established that the $\chi^2$ direction tends to align with the direction of the polling E field. Because of this, the rectified field acting as a voltage source will produce an effective positive terminal at the terminal that had the positive polling voltage.

We do not yet fully understand the current generation mechanism. In particular, it is not clear what provides the mechanism for charge transport across the gap. The APC material in which the nonlinear polymer is hosted is insulating, and though it does exhibit the photoconductivity effect due to visible light, it is unclear whether it can for near-infrared radiation. Photoconductivity due to second harmonic generation may play a role in this effect. It is certainly the case, however, that current flows through this gap; that is the only region in the entire system where an electromotive force exists. Also, photoconductivity alone is not adequate to explain the reversal of the current coming from the detector devices when the poling direction is reversed, nor the conversion of the optical input into directed current in general. The only mechanism to our knowledge that adequately explains this data is optical rectification.

If we assume that it will be possible to achieve a 10-fold improvement in the Q's of the resonators, while still getting more than 10 dB of extinction, then the intensity circulating in such a ring would be about 13 dB up from the intensity of the input wave. By comparison, with a Q of about 1000 and high extinction, the peak circulating intensity is about the same as the intensity in the input waveguide. Therefore, it is reasonable to expect that it will be possible to get at least 10 dB of improvement in the circulating intensity, and thus in the conversion efficiency, by fabricating higher Q rings.

By combining the nano-scale slotted waveguide geometry with electro-optical polymers having high nonlinear constants, we have obtained massive enhancement of the optical field. That has in turn enabled us to exploit nonlinear optical processes that are typically only available in the kW regime in the sub-mW regime. This difference is so considerable that we believe it represents a change in kind for the function of nonlinear optical devices. In addition, it is believed that this hybrid material system provides systems and methods for creating compact devices that exploit other nonlinear phenomena on-chip.

Optical rectification based detectors can have many advantages over currently available technology. In particular, such detectors are expected to function at a higher intrinsic rate than the typical photodiode in use, as the optical rectification process occurs at the optical frequency itself, on the order of 100 THz in WDM systems. The absence of an external bias, and the generation of a voltage rather than a change in current flow, both provide certain advantages in electronic operation. We also believe that a device based on nonlinear optical rectification will not suffer from the limitation of a dark current. This in turn can provide WDM systems that will function with lower optical power, providing numerous benefits. Similarly, our demonstration of enhanced modulation using these waveguide geometries provides useful components for future communications systems.

We believe that there will be advantageous economic aspects of such devices in various embodiments. Because our devices can be fabricated in planar electronics grade silicon-on-insulator, using processes compatible with advanced CMOS processing, it is expected that devices embodying these principles will be less expensive to fabricate.

Optical Modulators

Optical modulators are a fundamental component of optical data transmission systems. They are used to convert electrical voltage into amplitude modulation of an optical carrier frequency, and they can serve as the gateway from the electrical to the optical domain. High-bandwidth optical signals can be transmitted through optical fibers with low loss and low latency. All practical high-speed modulators that are in use today require input voltage shifts on the order of 1V to obtain full extinction. However it is extremely advantageous in terms of noise performance for modulators to operate at lower drive voltages. Many sensors and antennas generate only millivolts or less. As a result it is often necessary to include an amplifier in conventional optical transmission systems, which often limits system performance. By using silicon nano-slot waveguide designs and optical polymers, it is possible today to construct millivolt-scale, broadband modulators. In some embodiments, a millivolt-scale signal is one having a magnitude in the range of hundreds of millivolts down to units of millivolts. Using novel nanostructured waveguide designs, we have demonstrated a 100× improvement in Vπ over conventional electro-optic polymer modulators.

A variety of physical effects are available to produce optical modulation, including the acousto-optic effect, the Pockels effect either in hard materials, such as lithium niobate or in electro-optic polymers, free-carrier or plasma effects, electro-absorption, and thermal modulation. For many types of optical modulation, the basic design of a modulator is similar, a region of waveguide on one arm of a Mach-Zehnder interferometer is made to include an active optical material that changes index in response to an external signal. This might be, for instance, a waveguide of lithium niobate, or a semiconductor waveguide in silicon. In both cases, a voltage is introduced to the waveguide region by means of external electrodes. This causes the active region to shift in index slightly, causing a phase delay on the light traveling down one arm of the modulator. When the light in that arm is recombined with light that traveled down a reference arm, the phase difference between the two signals causes the combined signal to change in amplitude, with this change depending on the amount of phase delay induced on the phase modulation arm.

Other schemes, where both arms are modulated in order to improve performance, are also common.

Figure 13:
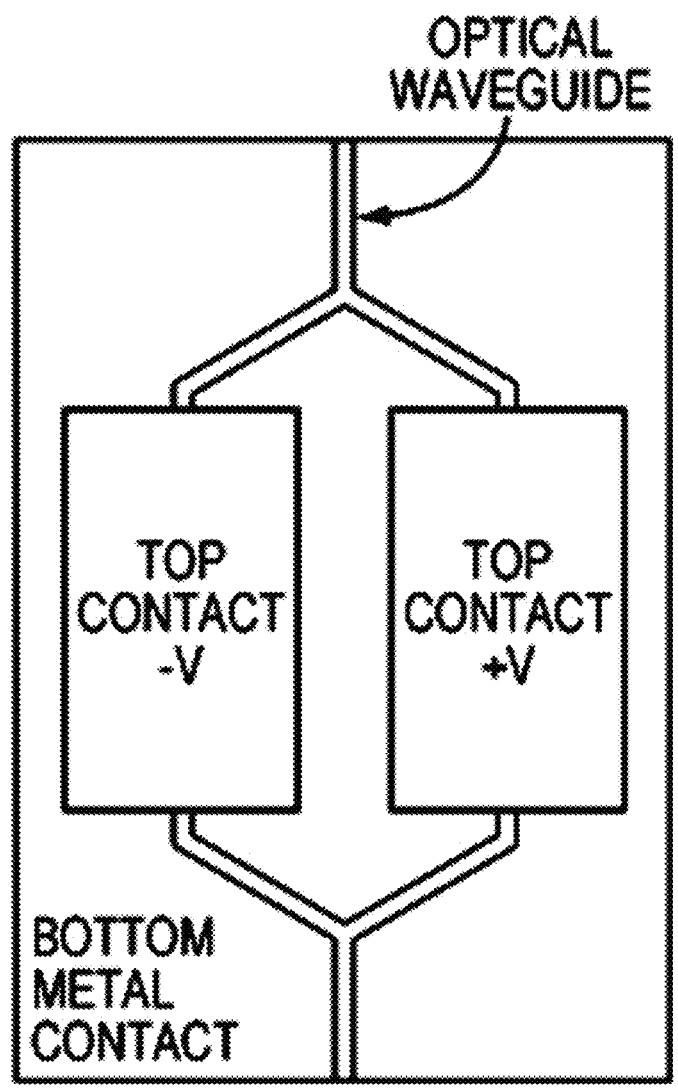
FIG. 13 shows a diagram of a Mach-Zehnder modulator with a conventional electrode geometry in top-down view, including top contact, waveguide, and bottom contact layers.

The measure of the strength of a modulation effect is how much phase shift is obtained for a given input voltage. Typical conventional modulators obtain effective index shifts on the order of 0.004% for 1 V. This implies that a Mach-Zehnder 1 cm in length, meant to modulate radiation near 1550 nm, would require 1 V of external input for the arms to accumulate a relative phase shift of π radians. The half wave voltage $V_\pi$ (or $V_{pi}$) is the voltage needed for an interarm phase shift of π radians (or 180 degrees). Lower values for $V_\pi$ imply that less power is needed to operate the modulator. Often, the responsivity, a length-independent product $V_\pi$-L is reported. Typical $V_\pi$-L values are in the range of 8 Vcm in silicon, or 6 V-cm for lithium niobate modulators. This voltage-length product, or responsivity, is an important figure of merit for examining a novel modulator design. Making a modulator physically longer generally trades lower halfwave voltage against reduced operating frequency and higher loss. Because generating high-speed and high-power signals requires specialized amplifiers, particularly if broadband performance is required, lowering the operating voltage of modulators is extremely desirable, particularly for on-chip integrated electronic/photonic applications, (including chip-to-chip interconnects) where on-chip voltages are limited to levels available in CMOS. FIG. 13 shows a diagram of a Mach-Zehnder modulator with a conventional electrode geometry.

FIG. 13 is a top-down view of a simple conventional Mach-Zehnder polymer interferometer, showing top contact, waveguide, and bottom contact layers. Such a device is usually operated in "push/pull" mode, where either opposite voltages are applied to the different arms, or where the two arms are poled in opposite directions to achieve the same effect.

In the past several years, silicon has gained attention as an ideal optical material for integrated optics, in particular at telecommunications wavelengths. Low loss optical devices have been built, and modulation obtained through free carrier effects. One of the waveguides that can be supported by silicon is the so-called slot waveguide geometry. This involves two ridges of silicon placed close to each other, with a small gap between them. We have demonstrated modulation regions based on tilling this gap with a nonlinear material, and using the two waveguide halves as electrodes. In such a geometry, the silicon is doped to a level that allows electrical conductivity without causing substantial optical losses. This allows the two wires or ridges to serve both as transparent electrical contacts and as an optical waveguide.

Using slot waveguides, we previously obtained an improvement in modulation strength of nearly 5× when compared to the best contemporary conventional waveguide geometries with electrodes separated from the waveguide, with the initial, non-optimized designs. This improvement was based on the remarkably small width of the gap across which the driving voltage drops. It is expected that smaller gaps translate into higher field per Volt, and the Pockels Effect depends on the local strength of the electric field. The smaller the gap, the larger the index shift. A unique property of slot waveguides is that, even as these gaps become nanoscale, the divergence conditions on the electric field require that much of the optical mode remains within the central gap. As a result, changing the index within a nanoscale gap can give a remarkably large change in the waveguide effective index. Because of these divergence conditions, the optical mode's effective index is largely determined by the shift found even in very small gaps.

Low $V_\pi$ Modulators

Several major approaches toward achieving low $V_\pi$ modulation have recently been pursued. The free-carrier dispersion effect in silicon waveguides has been used. Green et al. achieved a $V_\pi$ of 1.8 V with this effect. Modulators based on lithium niobate are also frequently used. Typical commercially obtained $V_\pi$ values are 4 V. Recently, Mathine and co-workers have demonstrated a nonlinear polymer based modulator with a $V_\pi$ of 0.65 V. For the devices produced by others, the attained values of $V_\pi$ are large.

A number of approaches have been proposed for developing low $V_\pi$ modulators. Different proposed approaches rely the development of new electrooptic materials, or on optical designs that trade bandwidth for sensitivity, either through the use of resonant enhancement, or through dispersion engineering. The designs presented herein are based upon conventional, high-bandwidth Mach-Zehnder traveling wave approaches, but achieve appreciable benefits from using nano-slot waveguides. Of course, these designs can also take advantage of the newest and best electrooptic polymers. In principle, any material that can be coated conformally onto the surface of the silicon waveguides and that is reasonably resistive could be used to provide modulation in these systems, making the system extremely general.

The most recent nonlinear polymers achieve a high nonlinear coefficient, expressed as an $r_{33}$ of 500 pm/V. Using this in combination with the high susceptibilities described above, it is believed that it is possible today to construct a 1 cm Mach-Zehnder modulator with a $V_\pi$ of 8 mV. This corresponds to a ring resonator with a tuning sensitivity of 795 GHz/V. Both of these values are two orders of magnitude better than the performance obtained by current approaches. Current commercially available modulators typically have Vπ's from 1 to 9 V, and current tunable electro-optic polymer based resonators achieve 1 GHz/V of tunability. If the $r_{33}$ value of 33 pm/V demonstrated by Tazawa and Steier for conventional polymer designs is used, then a $V_\pi$ of 64 mV and a resonator tunability of 50 GHz/V are obtained.

Segmented waveguide contact structures can be formed that allow very low resistance electrical contact to slot waveguides. We have described above, in similar circumstances, electrical contact to waveguides can be established via segmented waveguides. See FIG. 12B and FIG. 12D and the discussion related thereto. When the RC circuits implied by the segmentation geometry and the gap are examined, it is found that RC turn on times on the order of 200 GHz or more are achievable. Because the nonlinear polymers exhibit an ultrafast nonlinearity, these waveguide geometries present a path to making Terahertz scale optical modulators. Because the modulation is so strong, it is also possible to trade the length of the modulator against $V_\pi$. For example, our optimal geometry is expected obtain a Vπ of 0.6 V with a 100 μm long Mach-Zehnder modulator. This device is expected be exceptionally simple to design for 10 GHz operation, as it could likely be treated as a lumped element. We have shown above that lateral contact structures with low loss and low resistance can be constructed with these slot waveguides. See FIG. 12B and FIG. 12D and the discussion related thereto.

We believe these nano-slot waveguide designs present a path to realizing very high speed, low voltage modulators. It is advantageous to be able to attain a responsivity $V_\pi$-L of less than 1 V-cm. The physical principles involved in such devices are based on employing a nonlinear material of at least moderate resistivity, and a high index contrast waveguide with tight lithographic tolerances. Therefore, it is expected that nano-slot waveguides, either as Mach-Zehnder or ring-based devices, are likely an advantageous geometry for optical modulation with nonlinear materials in many situations. In addition, materials compatibility and processing issues are greatly reduced for such devices compared to conventional multilayer patterned polymer modulator structures.

These high index contrast devices have (or are expected to have) extremely small bend radii, which are often orders of magnitude smaller than corresponding all-polymer designs with low loss and high Q. These geometric features translate into extremely high free spectral ranges for ring modulators, compact devices, and wide process latitudes for their fabrication. Given the inexpensive and readily available foundry SOI and silicon processes available today, and the commercial availability of electron beam lithography at sub-10 nm line resolution, it is expected that slot-waveguide based modulators are likely to replace conventional modulators in many applications in the coming years.

Waveguide Geometries

Figure 14:
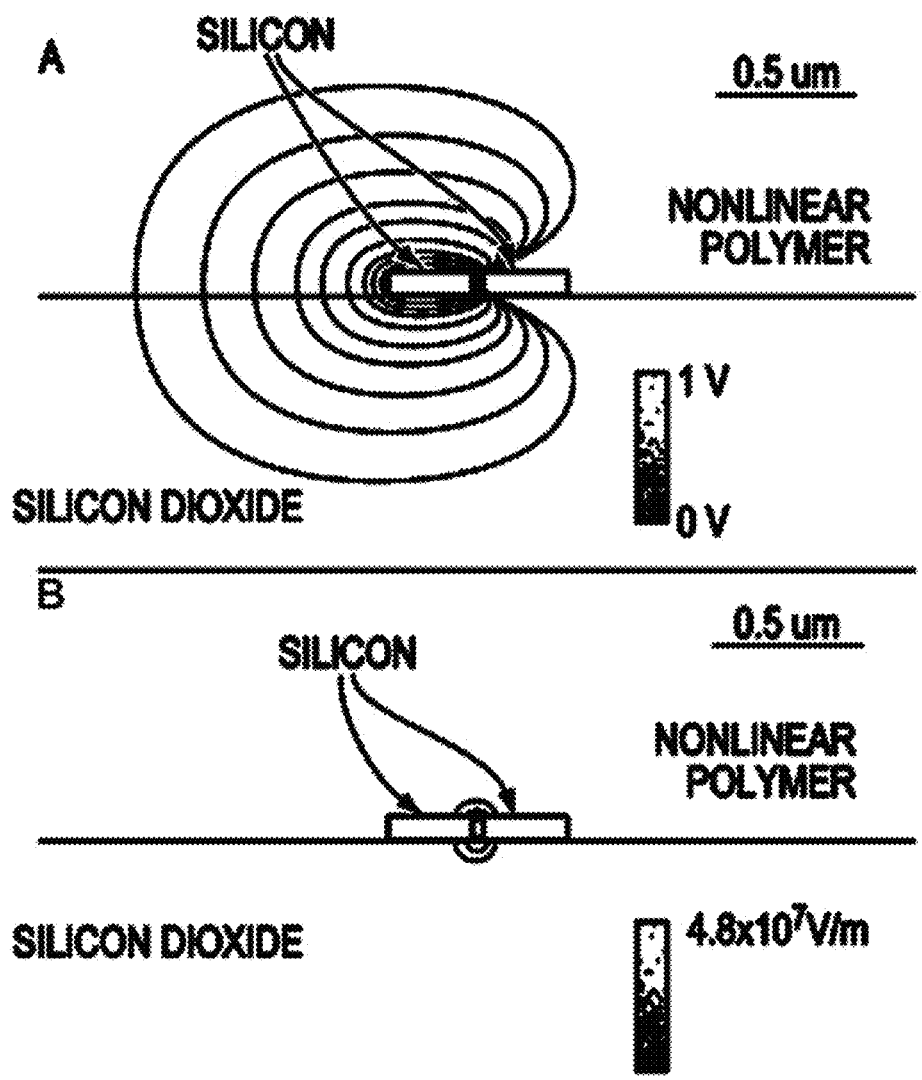
FIG. 14A shows the static voltage potential field distribution due to charging the two electrodes.
FIG. 14B shows the electric field due to the potential distribution. |E| is plotted in increments of 10%.

We now describe several different waveguide geometries, and show the effective index susceptibility as a function of the slot sizes of the waveguide. The susceptibilities are calculated near a 1550 nm free space wavelength. However, the values obtained will not vary much from 1480 nm to 1600 nm as the modal pattern does not change significantly. In the embodiments described, the waveguides are composed of silicon, and assumed to rest on a layer of silicon dioxide. The top cladding is a nonlinear polymer with an index of 1.7. This is similar to the waveguide geometry that we have used in our modulation work described hereinabove. FIG. 14 shows the static electric fields solved as part of analyzing waveguide design 1 with a gap of 40 nm, as described in Table 2. As one would expect, the field is nearly entirely concentrated inside the slot area. The field shown was calculated assuming a voltage difference of 1 Volt. It is slightly larger than simply the reciprocal of the gap size due to the singular nature of the solution to Poisson's equation near the corners of the waveguide.

FIG. 14A and FIG. 14B illustrate solved field patterns for the analysis of waveguide 1 at a 40 nm gap. FIG. 14A shows the static voltage potential field distribution due to charging the two electrodes. FIG. 14B shows the electric field due to the potential distribution. |E| is plotted in increments of 10%.

We have constrained ourselves to use waveguide geometries that have minimum feature sizes of at least 20 nm. These are near the minimum feature sizes that can be reliably fabricated using e-beam lithography. Table 2 lists a description of each type of waveguide studied. Each waveguide was studied for a number of different gap sizes. In all cases, the maximum susceptibility was obtained at the minimum gap size. The maximum gap size studied and the susceptibility at this point are also listed. In some cases, the study was terminated because at larger gap sizes, the mode is not supported; this is noted in Table 2. For multislot waveguide designs where there are N arms, there are N–1 gaps; the design presumes that alternating arms will be biased either at the input potential or ground.

Table 2 shows the effective index susceptibility for various waveguide designs. The susceptibility is approximately inversely proportional to gap size.

It is clear that within the regime of slotted waveguides, it is always advantageous to make the slot size smaller, at least down to the 20 nm gap we have studied. This causes the DC electric field to increase, while the optical mode tends to migrate into the slot region, preventing any falloff due to the optical mode failing to overlap the modulation region.

TABLE 2

| Waveguide Design | Waveguide Height (nm) | Arm Sizes (nm) | Maximum γ ($\mu m^{-1}$) | Minimum γ ($\mu m^{-1}$) |
|---|---|---|---|---|
| 1 | 100 | 300, 300 | 1.3, 20 nm gap | .40, 140 nm gap |
| 2 | 150 | 300, 300 | 1.6, 20 nm gap | .68, 120 nm gap |
| 3 | 200 | 300, 300 | 2.3, 20 nm gap | .74, 120 nm gap |
| 4 | 100 | 400, 400 | 1.1, 20 nm gap | .67, 60 nm gap, modal limit |
| 5 | 100 | 250, 250 | 1.2, 20 nm gap | .56, 60 nm gap, modal limit |
| 6 | 100 | 300, 40, 300 | 1.6, 20 nm gap | .53, 80 nm gap, modal limit |
| 7 | 100 | 300, 40, 40, 300 | 1.9, 20 nm gap | .76, 60 nm gap, modal limit |
| 8 | 200 | 200, 40, 200 | 3, 20 nm gap | 1.4, 60 nm gap, modal limit |
| 9 | 300 | 300, 300 | 2.5, 20 nm gap | 2.5, 20 nm gap, modal limit |
| Steier et al. | N/A | N/A | .026, 10 μm gap | N/A |

In examining the results of our calculations, it is useful to calculate the maximum susceptibilities that can be obtained. For an effective index of about 2, which is approximately correct for these waveguides, and a gap size of 20 nm, the maximum achievable γ is approximately 12.5 $\mu m^{-1}$. Thus, for a gap size of 20 nm, waveguide design 8 is already within 25% of the theoretical maximum value.

It is also worth noting the corresponding γ value that can be obtained by calculation using our methods for the separated electrode approach of Steier. The effective index of the mode is expected to be about 1.8, and the gap distance for the dc field is 10 um. Under the most optimistic assumptions about mode overlap with the active polymer region (that is, assuming complete overlap), this corresponds to a γ of about 0.03 $\mu m^{-1}$.

It is useful to calculate, given the current $r_{33}$ values that are available, the index tuning that might be achieved with these designs. The most advanced polymers now yield $r_{33}$ values of 500 pm/V. If a bulk refractive index of 1.7 is used, then a $\partial n/\partial V$ of 0.006 $V^{-1}$ is obtained with the best design given above. Using a waveguide with an effective index of 2 and a group index of 3, which are typical of silicon-polymer nanoslot waveguides, the $V_\lambda$ for a Mach-Zehnder with a length of 1 cm is expected to be about 6 mV. The resonance shift that is expected to be obtained in a ring resonator configuration would be 380 GHz per volt. Both of these values represent orders of magnitude improvement in the performance of these devices compared to current designs.

Segmented Contacting

As we have shown empirically, silicon can be doped to about 0.025 Ω-cm of resistivity with a n-type dopant without substantially increasing losses. Other dopants or perhaps other high index waveguiding materials may have even higher conductivities that can be induced, without significantly degrading optical performance. However, it is known that the conductivity cannot be increased endlessly without impacting optical loss.

This naturally presents a serious challenge for the issue of driving a slot waveguide of any substantial length. Consider a slot waveguide arm of length 1 mm, formed of our optimal design. The capacitor formed by the gap between the two electrodes is about 0.25 pF. The 'down the arm' resistance of the structure, however, is 4 MΩ. Therefore, the turn on time of an active waveguide based on this is about 0.1 μS, implying a 10 MHz bandwidth.

A solution to this problem is presented by continuously contacting the waveguide via a segmented waveguide. This comprises contacting the two silicon ridges with a series of silicon arms. Even though the silicon arms destroy the continuous symmetry of the waveguide, for the proper choice of periodicity no loss occurs, and the mode is minimally distorted. This is because a Bloch mode is formed on the discrete lattice periodicity, with no added theoretical loss. Of course the performance of fabricated devices will be different from that of conventional slot waveguides due to fabrication process differences. We have previously demonstrated empirically that continuous electrical contact can be formed for non-slotted waveguide via segmentation with relatively low optical losses.

Figure 15:
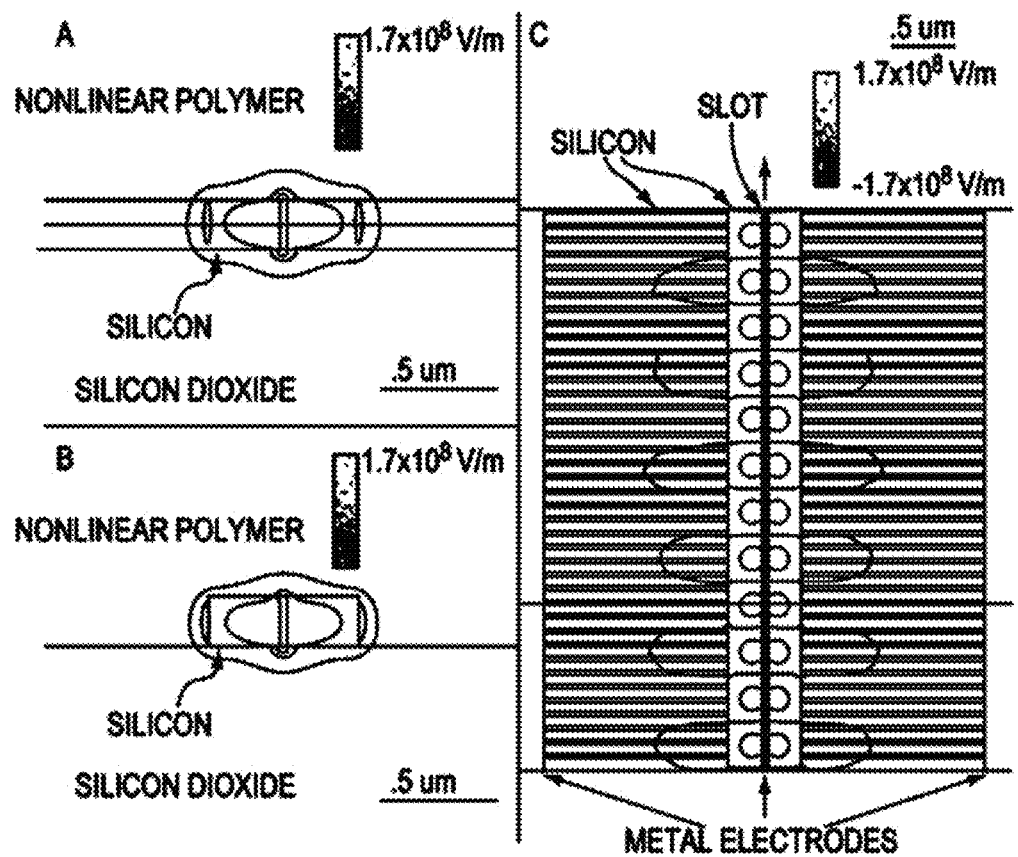
FIG. 15A shows a cross section of the segmented, slotted waveguide, with the |E| field plotted in increments of 10% of max value.
FIG. 15B shows a similar plot for the unsegmented waveguide.
FIG. 15C shows a horizontal cross section of the segmented, slotted waveguide in which Re(Ex) is plotted in increments of 20% of max.

Here we present a simulation of a particular segmentation geometry for our optimal slot waveguide design, that with 200 nm tall and 300 nm wide arms and a gap of 20 nm. We have found that a segmentation with 40 nm arms, and a periodicity of 100 nm, appears to induce no loss or significant mode distortion in the waveguide. Around 2 um of clearance appears to be needed from the edge of the segmented waveguide to the end of the arms. FIG. 15A, FIG. 15B and FIG. 15C show plots of several cross sections of the segmented slot waveguide with a plot of the modal pattern overlaid. For comparison, a cross section of the unsegmented slot waveguide is presented as well. Simulations were also performed to confirm that the index shift formula continued to apply to the segmented slotted waveguide. It was found that the index shift was in approximate agreement with the value predicted for the non-segmented case. Non-segmented mode-solvers were used for the rest of the simulations in this work, because simulation of the segmented designs is radically more computationally burdensome than solving for the unsegmented case, as they require solving for the modes of a 3d structure. Since the index shifts for the unsegmented and segmented cases are extremely similar, solving for the modes in the unsegmented cases is adequate for purposes of design and proof-of-concept.

FIG. 15A shows a cross section of the segmented, slotted waveguide, with the |E| field plotted in increments of 10% of max value. FIG. 15B shows a similar plot for the unsegmented waveguide. FIG. 15C shows a horizontal cross section of the segmented, slotted waveguide; Re(Ex) is plotted in increments of 20% of max. In an actual device, some sort of metal based transmission line would undoubtedly provide the driving voltage for the waveguide. The metal electrodes that would likely form part of this transmission line have been noted in FIG. 15C. In all cases the mode has been normalized to have 1 Watt of propagating power. FIG. 15A and FIG. 15C show the location of the other respective cross section as a line denoted C in FIG. 15A and A in FIG. 15C.

Assuming a 0.025 $\Omega$-cm resistivity, one can calculate the outer arm resistance as 63 k$\Omega$ per side per period, while the inner arm resistance is 25 k$\Omega$ per side per period. The gap capacitance per period is $2.5 \times 10^{-17}$ Farads. This implies a bandwidth on the order of 200 GHz.

We now describe an electro-optic modulator fabricated from a silicon slot waveguide and clad in a nonlinear polymer. In this geometry, the electrodes form parts of the waveguide, and the modulator driving voltage drops across a 120 nm slot. As a result, a half wave voltage of 0.25 V is achieved near 1550 nm. This is one of the lowest values for any modulator obtained to date. As the nonlinear polymers are extremely resistive, our device also has the advantage of drawing almost no current. It is believed that this type of modulator could operate at exceedingly low power.

A unique advantage with nonlinear polymers is that an integrated optical circuit can be conformally coated by a nonlinear polymer. This property, when combined with a slot waveguide, enables the construction of a uniquely responsive modulator. We describe the use of a push-pull Mach-Zehnder modulator configuration in which each arm has an opposing bias, leading to an opposing phase shift.

Figure 16:
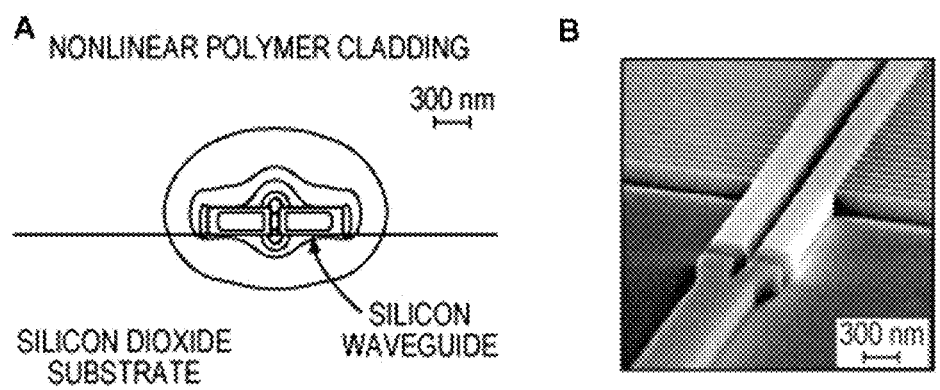
FIG. 16A is a diagram of the silicon slot waveguide used in the Mach-Zehnder modulator, according to principles of the invention.
FIG. 16B is an SEM micrograph of a slot waveguide, according to principles of the invention.

FIG. 16A shows the slot waveguide used for the Mach-Zehnder modulator. The modal pattern near 1550 nm is plotted, and contours of |E| are shown. FIG. 16B is an SEM micrograph of a slot waveguide. In this case, the slot waveguide is being coupled to with a ridge waveguide; this mode converter involves tiny gaps which ensure electrical isolation between the two arms. Contacting arms are also present around 3 μm from the ridge/slot junction. The dimensions are two 300×100 nm arms separated by a 120 nm slot.

Nonlinear polymers typically have very high resistivity of $10^{11}$ $\Omega$cm. As a result, the two silicon arms are electrically isolated and can be used as modulator electrodes. The voltage drop between the arms occurs across a 120 nm electrode spacing, as opposed to the 5-10 μm that is typically required for modulators involving a nonlinear polymer and metallic contacts. This is a fundamental advantage that slot waveguide geometries have for electro-optic modulation.

It is advantageous to contact the silicon arms with an external electrode throughout the length of the Mach-Zehnder device to minimize parasitic resistances. We use a segmented waveguide in which a periodic set of small arms touches both waveguide arms. We use a segmentation with a periodicity of 0.3 μm and arm size of 0.1 μm that is largely transparent to the optical mode.

Figure 17:
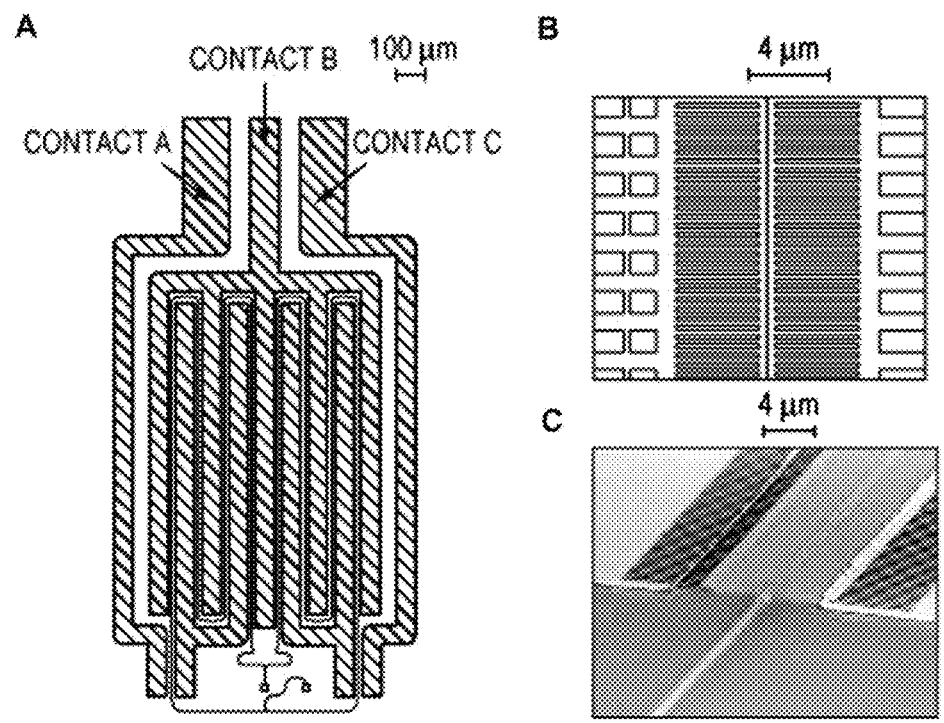
FIG. 17A is a diagram of the modulator layout, according to principles of the invention.
FIG. 17B and FIG. 17C are two SEM micrographs of modulators constructed according to principles of the invention, that show the slotted, segmented region, as well as the location where the silicon makes contact with the electrical layer.

Because the polymer has a second order nonlinearity, a Mach-Zehnder modulator can be operated in push-pull mode, even with no dc bias, effectively doubling the modulator response. FIG. 17A is a diagram of the modulator layout, in which contacts A, B, and C are shown. FIG. 17B is a diagram and FIG. 17C is a SEM micrograph that show the slotted, segmented region, as well as the location where the silicon makes contact with the electrical layer.

Referring to FIG. 17A, there are three regions in the modulator that are capable of maintaining distinct voltages. During poling operation, contact A is given a voltage of $2V_{pole}$, contact B a voltage of $V_{pole}$, and contact C is held at ground. To achieve a poling field of 150 V/μm, $V_{pole}$ was 18 V. This has the effect of symmetrically orienting the polymer in the two Mach-Zehnder arms. During device operation, contact B is driven at the desired voltage, while contacts A and C are both held at ground, leading to asymmetric electric fields in the two arms for a single bias voltage. This is the source of the asymmetric phase response. Electrical regions A and C cross the waveguide by means of a slotted ridged waveguide. At the ridge to slot mode converter, a small gap is left that maintains electrical isolation but is optically transparent. This enables the device to be built without requiring any via layers. A driving voltage from a DC voltage source was applied to contact B, while contacts A and C were held at ground.

Figure 18:
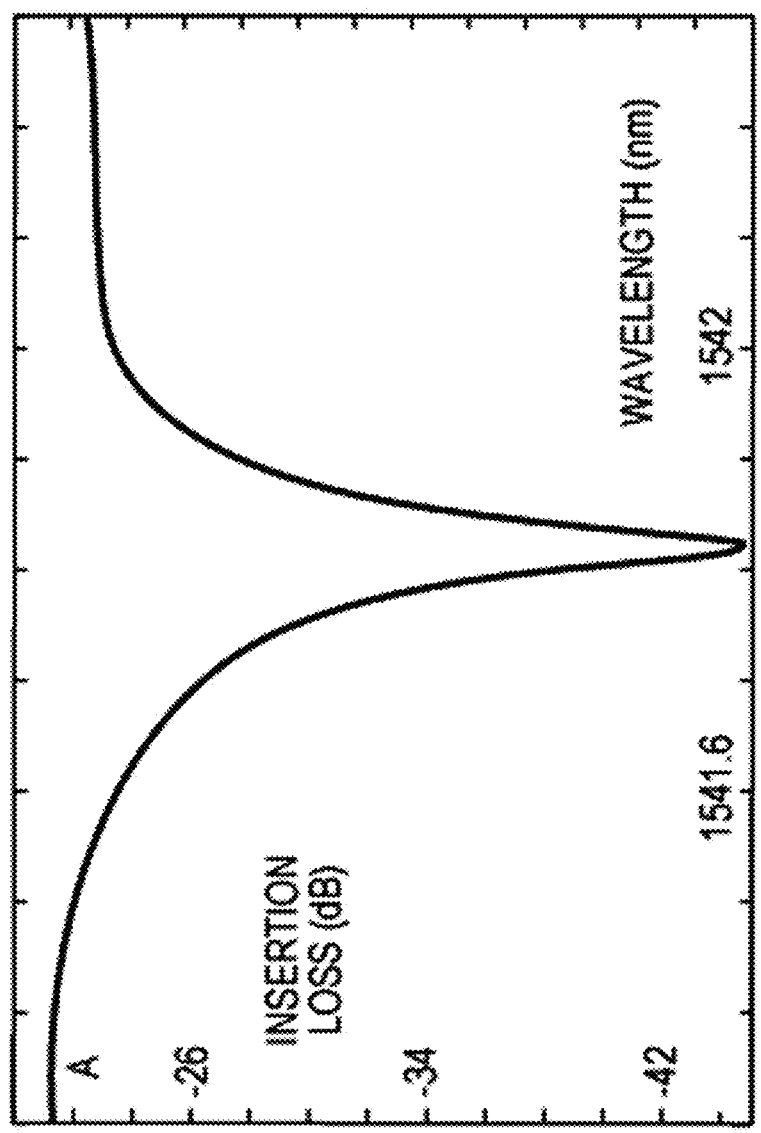
FIG. 18 is a diagram that shows a transmission spectrum of an electroded slot waveguide resonator with a gap of 70 nm. Fiber to fiber insertion loss is plotted in dB, against the test laser wavelength in nm.

We have recently demonstrated empirically that slot sizes of around 70 nm can be fabricated in 110 nm SOI as ring resonators with electrical contacts. FIG. 18 is a diagram that shows a transmission spectrum of an electroded slot waveguide resonator with a gap of 70 nm. Fiber to fiber insertion loss is plotted in dB, against the test laser wavelength in nm. We have also confirmed through electrical measurements that the two halves of the slots are largely electrically isolated.

We believe that there is the possibility of constructing even narrower slot waveguides, on the scale of 1-5 nm in thickness.

For example, one could use epitaxial techniques to grow a horizontal slot structure (rather than the vertical structures we have explored thus far) with an active, insulating material, with silicon beneath and above. This could be done in a layer form analogous to SOI wafer technology, in which a very thin layer of electroactive material such as the polymers we have described herein could be introduced. Such structures offer the possibility of yet another order of magnitude of improvement in the low-voltage performance of modulators. We anticipate our slot structures to be fairly robust even in the presence of fabrication errors. Fabrication imperfections may cause some of the narrower slots to have tiny amounts of residual silicon or oxide in their centers, or to even be partially fused in places. As long as electrical isolation is obtained, and the optical loss is acceptable, we would expect the slot performance to decrease only in a linear proportion to the amount of the slot volume that is no longer available to the nonlinear polymer cladding.

The description provided herein may be augmented by the descriptions provided in the following patents and pending patent applications: U.S. Pat. Nos. 7,200,308, 7,424,192, U.S. Patent Application Publication No. 2009/0022445A1, U.S. patent application Ser. No. 12/167,063, PCT/US2009/33516, and PCT/US2009/36128.

Integrated Optics

It has recently emerged that silicon is an ideal material system for integrated optics in the near infrared, particularly for chip-to-chip interconnects at speeds in the gigahertz. We now find ourselves with the opportunity to exploit the massive industrial investment in silicon fabrication and design infrastructure in order to build massively integrated photonic circuits in silicon. For instance, under the DARPA EPIC (Electronic & Photonic Integrated Circuits) program, a single-chip radio-frequency front-end has been developed which replaces two entire 19" racks of conventional RF and photonic components, and provides significantly improved performance. At Luxtera, the first product is a 40-gigabit per second data cable, with electrical connectors, that can transmit bi-directional data over hundreds of meters, is aimed at supercomputing and data center applications. This chip-scale system integrates thousands of optical components including laser sources, modulators and detectors—and hundreds of thousands of transistors, onto a single chip. Further applications massively parallel, multi-terabit per second data transmission through the use of wavelength division multiplexing.

There has been significant progress in both the commercial and academic worlds on building individual optical devices silicon platform, primarily aimed at data transmission applications. Many of the components of a communications system, operating at speeds below 20 gigahertz, have already been demonstrated both academia and in industry. These devices include high-Q optical cavities, electrooptic modulators based on manipulating carrier density, slow-light architectures for optical memory, optically pumped silicon lasers, optical detectors at 1550 nm, optical parametric amplifiers, Raman lasers, optical logic in the high megahertz range, evanescently coupled lasers and a wide variety of photonic crystal based waveguides and resonators, however, the carrier-based modulators built under EPIC and at Luxtera are not suitable for low-noise analog applications since they require significant bias voltages, and their linearity is likely to be inadequate.

Nanostructured silicon photonic waveguides provide a remarkable platform for nonlinear optics. Polymerclad slot guides have been used to create a variety of high performance devices, including in particular the world's lowest-voltage electro-optic modulators, optical rectification based detectors and Pockels' Effect based ring modulators, and all-optical modulators with more than 1 THz of signal bandwidth.

Figure 19:
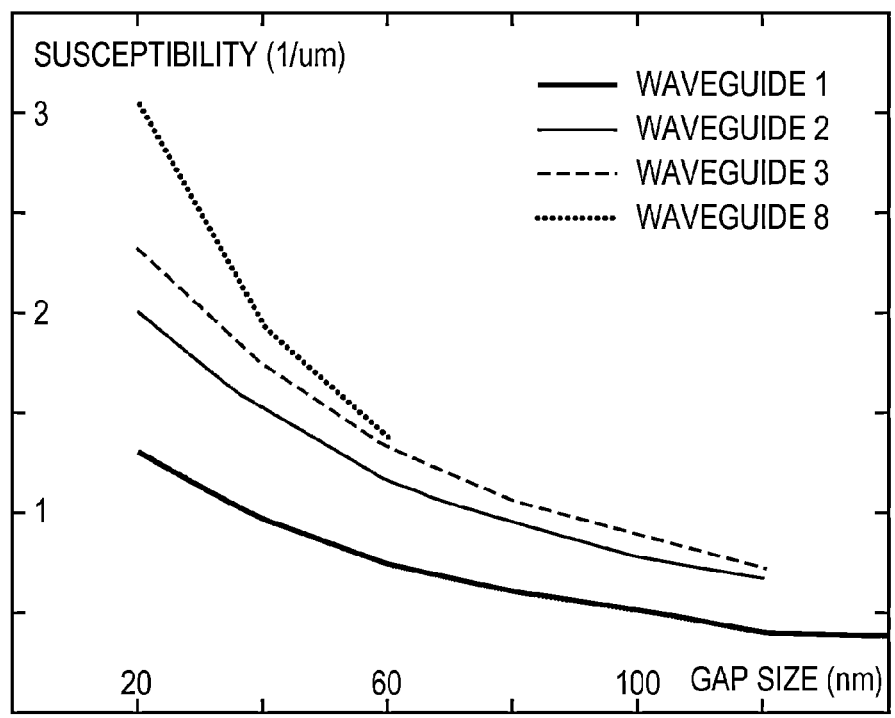
FIG. 19 shows a graph of susceptibility (1/μm) plotted against gap size in nm for several exemplary waveguides.

We have developed silicon waveguides which can be evanescently coupled to a variety of cladding materials. In particular, we have developed nano-slot wave guides that are clad with electrooptic and Kerr effect nonlinear optical polymers. As the slot width decreases, the performance of the modulator improves. FIG. 19 shows a graph of susceptibility (1/μm) plotted against gap size in nm for several exemplary waveguides. Such polymers exhibit nonlinear optical properties that are as much as an order of magnitude stronger than conventional nonlinear optical materials, such as Lithium Niobate, and are believed to be the strongest ultrafast nonlinear optical materials by an order of magnitude. The slot waveguides, because of their nanoscale features, concentrate optical modes into areas that are orders of magnitude smaller than those of single mode optical fibers. Their enormous concentration of optical energy, located in the slot, translates into a dramatic enhancement of the electric field associated with the optical mode. This enhanced field is located not in the silicon, but in the slot region, which is filled with electrooptic organic material with greatly enhanced optical nonlinearity. As a result, the figure of merit associated with these waveguides, when filled with active nonlinear materials, is believed to be orders-of magnitude higher than that achieved in any alternative system.

Figure 20:
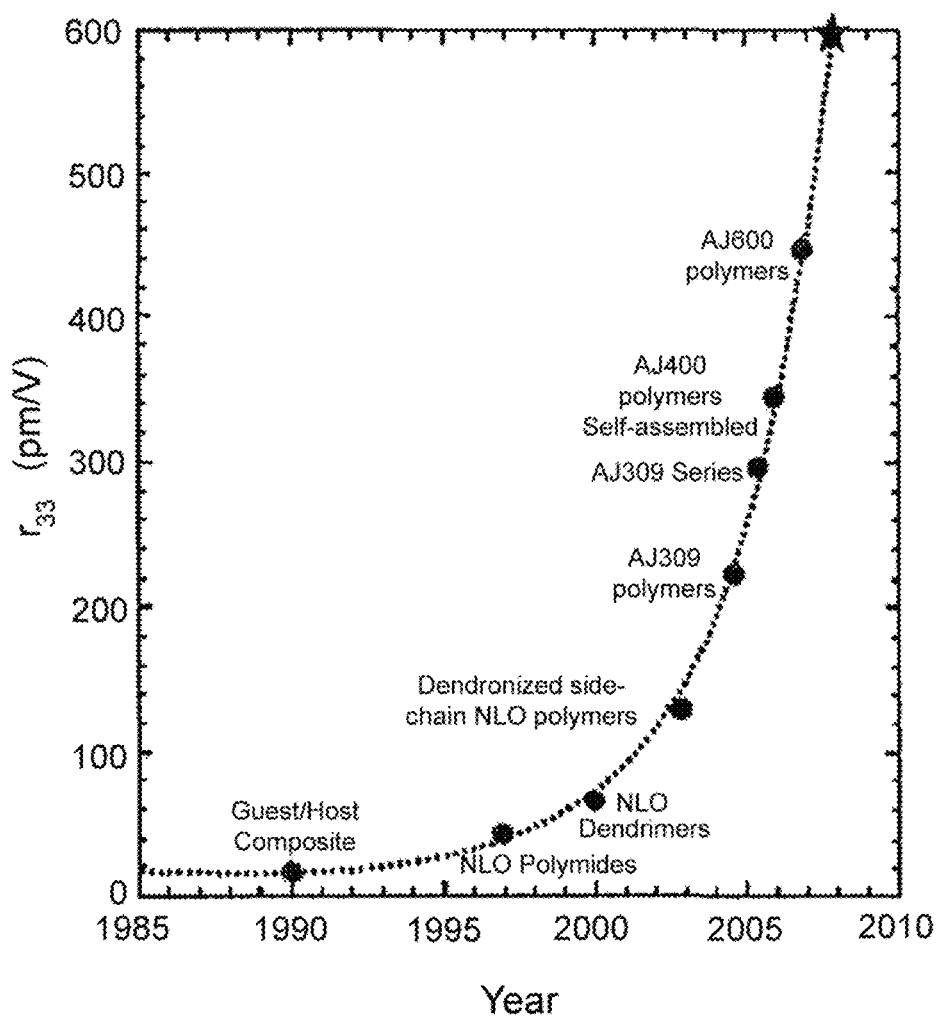
FIG. 20 shows a graph of the evolution of optical materials plotted as $r_{33}$ electro-optic activity in pm/V versus the year of development.

The electro-optic activity of engineered organic materials has followed an exponential curve over the past decade, making them now the most non-linear ultrafast optical materials. Organic materials are typically more than an order of magnitude stronger than lithium niobate, the most common nonlinear optical material in use today. FIG. 20 shows a graph of the evolution of optical materials plotted as $r_{33}$ electro-optic activity in pm/V versus the year of development.

An additional advantage of the silicon system comes from the ability to straightforwardly fabricate many devices within the same chip, and to use lithography to align them together. As a result, there is only one optical alignment needed in packaging the devices; it is possible to address an entire optical system with a single fiber array connecting to the outside world. By integrating multiple devices onto the same chip, a single optical alignment can be used to address hundreds or even thousands of different optical components, all of which can comprise a single complex system.

Split Waveguides and Optical Polymers

We have developed a set of tools for concentrating light to a high degree by using silicon or other high index contrast waveguides, and we have fabricated devices that demonstrate some of the many applications that can be contemplated when such nonlinear materials are exploited. In particular, by utilizing split waveguides, we are able to greatly enhance the optical fields in the cladding of a tightly confined waveguide, without greatly enhancing the optical losses of the same waveguide. Combining the high field concentrations available from the split waveguides with the high nonlinear activity of nonlinear optical polymers permits the development of nonlinear optical devices which can operate at much lower optical input power levels than are possible with conventional free space or chip based systems. We have demonstrated four-wave mixing (which is based upon $\chi^3$), as well as optical rectification (based on $\chi^2$), in such waveguides. Using these waveguides it is possible to decrease the power levels needed to observe significant nonlinearities to the point where, by contrast with conventional nonlinear optics, it can be done with non-pulsed, continuous wave lasers.

Prior Art Electro-Optic Modulators

Electro-optic (E-O) modulators serve as the gateway between the electrical and optical domains, and as such, are a component in many radio frequency systems. Today, such modulators are primarily made out of Lithium Niobate. Commercial Lithium Niobate devices typically require around 3 volts for full extinction drive at speeds of 30 GHz, with around 4 dB of loss. Because of the relatively high full extinction voltage, additional amplifiers are needed to drive Lithium Niobate modulators. These additional amplifiers can be a significant source of nonlinearity in high-speed analog systems.

Silicon Waveguides

We have developed silicon waveguides which can be evanescently coupled to a variety of cladding materials. In particular, we have developed nano-slot wave guides that are clad with electrooptic and Kerr effect nonlinear optical polymers. Such polymers exhibit nonlinear optical properties that are as much as an order of magnitude stronger than conventional nonlinear optical materials, such as Lithium Niobate, and are to our knowledge, the strongest ultrafast nonlinear optical materials in the world by an order of magnitude. The slot waveguides, because of their nanoscale features, concentrate optical modes into areas that are orders of magnitude smaller than those of single mode optical fibers. Their enormous concentration of optical energy, located in the slot, translates into a dramatic enhancement of the electric field associated with the optical mode. This enhanced field is located not in the silicon, but in the slot region, which is filled with electrooptic organic material with greatly enhanced optical nonlinearity. As a result, the figure of merit associated with these waveguides, when filled with active nonlinear materials, is orders-of magnitude higher than that achieved in any alternative system. An additional advantage of the silicon system comes from the ability to straightforwardly fabricate many devices within the same chip, and to use lithography to align them together. As a result, there is only one optical alignment needed in packaging the devices and it is possible to address an entire optical system with a single fiber array connecting to the outside world. By integrating multiple devices onto the same chip, a single optical alignment can be used to address hundreds or even thousands of different optical components, all of which can comprise a single complex system.

Silicon-Polymer Modulator

We are also developing a silicon-polymer modulator at 20 GHz, with a 250 mV drive voltage. For purposes of comparison, today's typical 30 GHz modulators provide approximately −1 dB of E-O power gain when operating with 500 mW of input power. It is contemplated that such devices can eventually offer up to as much as about 44 dB of gain from the E-O transition, at 100 GHz bandwidth. The availability of such modulators will result in a radical re-engineering of a variety of military and civilian analog data communication system. We have recently found, very surprisingly, that by making the slot smaller, a 14 µm geometry increases the modulation effect, so that the modulation strength is nearly inversely proportional to the size of the gap. The reason this increases the modulation effect is that even for slots as small as 0.02 µm, the TE optical mode will still be largely concentrated in the central slot. This implies that nearly an additional order of magnitude in modulation enhancement can be obtained over the performance previously demonstrated. When combined with recent developments of nonlinear polymers with $r_{33}$ values of 130 pm/V and 500 pm/V, it is contemplated that a modulator with a $V_\pi$-L on the order of 4 mV-cm, and that resonators with a tunability of 0.5 THz/V can be built, which would represent a substantial enhancement over the current state of the art. It is contemplated that this work will use advanced device fabrication as well as integration of advanced electrooptic organic materials. FIG. rr shows a grazing-angle SEM image of one exemplary silicon slot waveguide and resonator, a slot ring resonator directional coupler region, and the associated input waveguide.

Electro-Optic Materials

The DARPA Super Molecular Photonics (MORPH) program is an exploratory effort to demonstrate that engineered molecular nano-systems can achieve increases in optical nonlinearity. The best organic electrooptic materials developed so far under the MORPH program provide electrooptic activity of approximately 600 pm/V. An electrooptic activity of approximately 600 pm/V is believed to be adequate for fabrication of the devices and systems described herein. Significant challenges exist (e.g. challenges with poling and charge injection at the surfaces) in integrating these high activity materials into the silicon slot waveguide system. The highest activity that has been realized to date in a slot guide is around 30 pm/volt. It has emerged that poling in these nanoscale waveguides is a significantly different problem from that of poling larger all-organic or sol-gel/organic devices. It is contemplated that charge injection can be controlled by varying doping levels and surface coatings on the slot guides (probably through the use of atomic layer deposition). In addition, it is contemplated that organic materials can be engineered to adapt them to the silicon waveguide system and to improve the stability of the most active materials.

Low Drive Voltage Modulator

Figure 21:
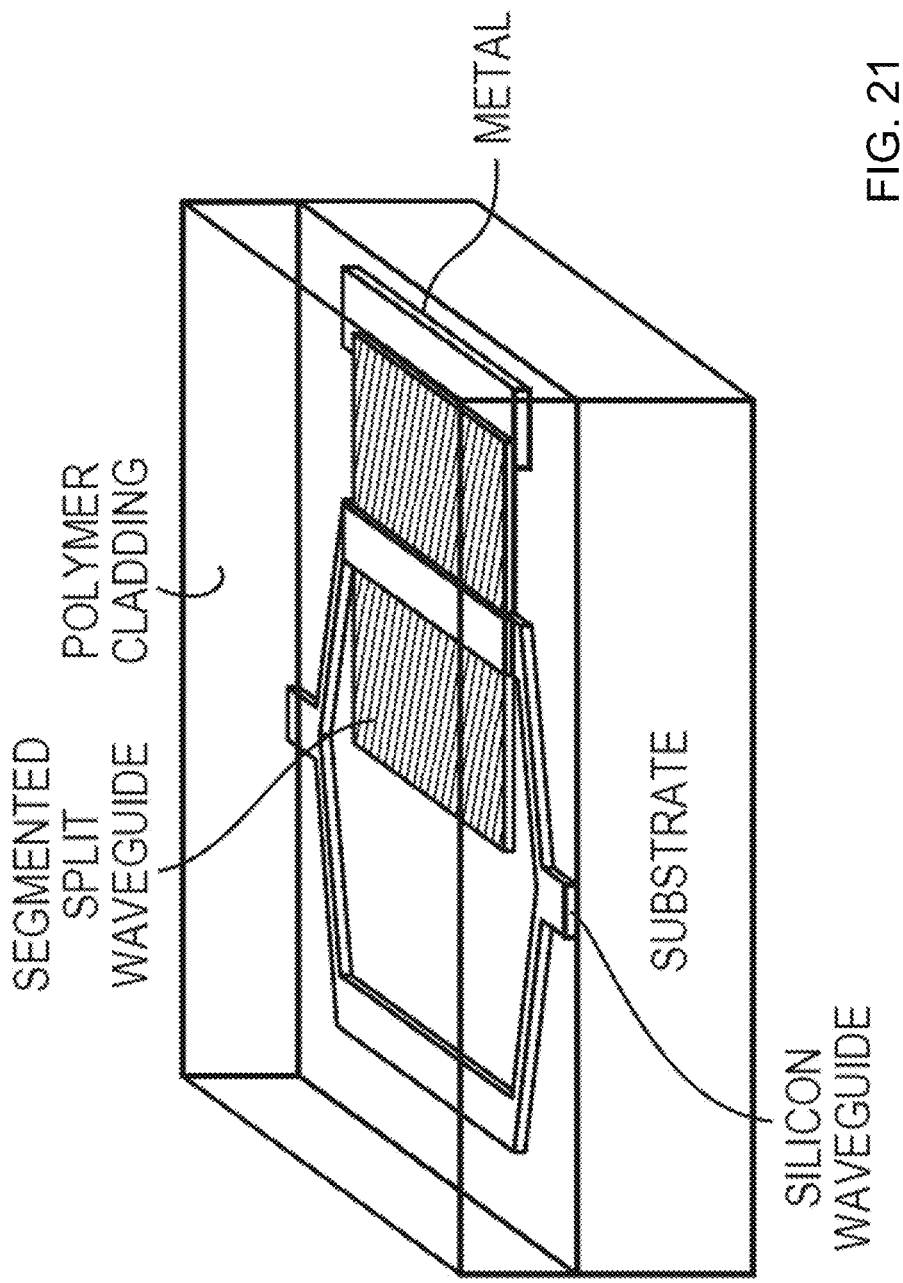
FIG. 21 shows a three dimensional sketch of an exemplary slot waveguide modulator.

As introduced hereinabove, one exemplary low drive voltage modulator that is suitable for use in the inventive devices and systems described herein. FIG. 21 shows a three dimensional sketch of an exemplary slot waveguide modulator. FIG. 16A shows one exemplary slot waveguide used for the Mach-Zehnder modulator of a low drive voltage modulator. The modal pattern near 1550 nm is plotted, and contours of |E| are shown. FIG. 16B shows an SEM micrograph of a slot waveguide. The slot waveguide is coupled to a ridge waveguide. A mode converter involves tiny gaps which ensure electrical isolation between the two arms. Contacting arms are also present around 3 µm from the ridge/slot junction. The dimensions are two 300 nm×100 nm arms separated by a 120 nm slot.

Since nonlinear polymers typically have a very high resistivity of $10^{11}$ Ω-cm, the two silicon arms are electrically isolated and can be used as modulator electrodes. The voltage drop between the arms occurs across a 120 nm electrode spacing, as opposed to the 5-10 µm that is typically required for modulators involving a nonlinear polymer and metallic contacts. This nm electrode spacing offers a fundamental advantage that slot waveguide geometries have for electrooptic modulation.

Also, it is advantageous to contact the silicon arms with an external electrode throughout the length of the Mach-Zehnder device to minimize parasitic resistances. We use a segmented waveguide in which a periodic set of small arms touches both waveguide arms. One suitable segmentation, which is largely transparent to the optical mode, has a periodicity of 0.3 µm and arm size of 0.1 µm. Because the polymer has a second order nonlinearity, a Mach-Zehnder modulator can be operated in a push-pull mode, even with no dc bias, effectively doubling the modulator response.

We have recently demonstrated empirically that slot sizes of around 70 nm can be fabricated in 110 nm SOI as ring resonators with electrical contacts. Fiber to fiber insertion loss is plotted in dB, against the test laser wavelength in nm.

We have also confirmed through electrical measurements that the two halves of the slots are largely electrically isolated.

It is contemplated that even narrower slot waveguides, on the scale of 1-5 nm in thickness, can be built. For example, one could use epitaxial techniques to grow a horizontal slot structure (rather than the vertical structures we have explored thus far) with an active, insulating material, with silicon beneath and above. This could be done in a layer form analogous to SOI wafer technology, in which a very thin layer of electroactive material such as the polymers we have described herein could be introduced. Such structures offer the possibility of yet another order of magnitude of improvement in the low-voltage performance of modulators. We anticipate our slot structures to be fairly robust even in the presence of fabrication errors. Fabrication imperfections may cause some of the narrower slots to have tiny amounts of residual silicon or oxide in their centers, or to even be partially fused in places. However, as long as electrical isolation is obtained, and the optical loss is acceptable, we would expect the slot performance to decrease only in a linear proportion to the amount of the slot volume that is no longer available to the nonlinear polymer cladding.

The description provided herein can be augmented by the descriptions provided in the following patents and pending patent applications: U.S. Pat. Nos. 7,200,308, 7,424,192. U.S. Patent Application Publication No. 2009/0022445A1, U.S. patent application Ser. No. 12/167,063, PCT/US2009/335 16, and PCT/US2009/36128, all of which patents and applications are incorporated herein by reference in their entirety for all purposes.

Electric Field Sensor

We define an electric field sensor herein as including a device that measures a voltage at one point, and produce an amplified voltage elsewhere. Our electric field sensors can be viewed in essence as very low-noise voltage amplifiers. Our inventive electric field sensors can configured for non-contact or contactless sensing and/or measurement of electric fields and can have a bandwidth ranging from DC to over 1 GHz.

Figure 22:
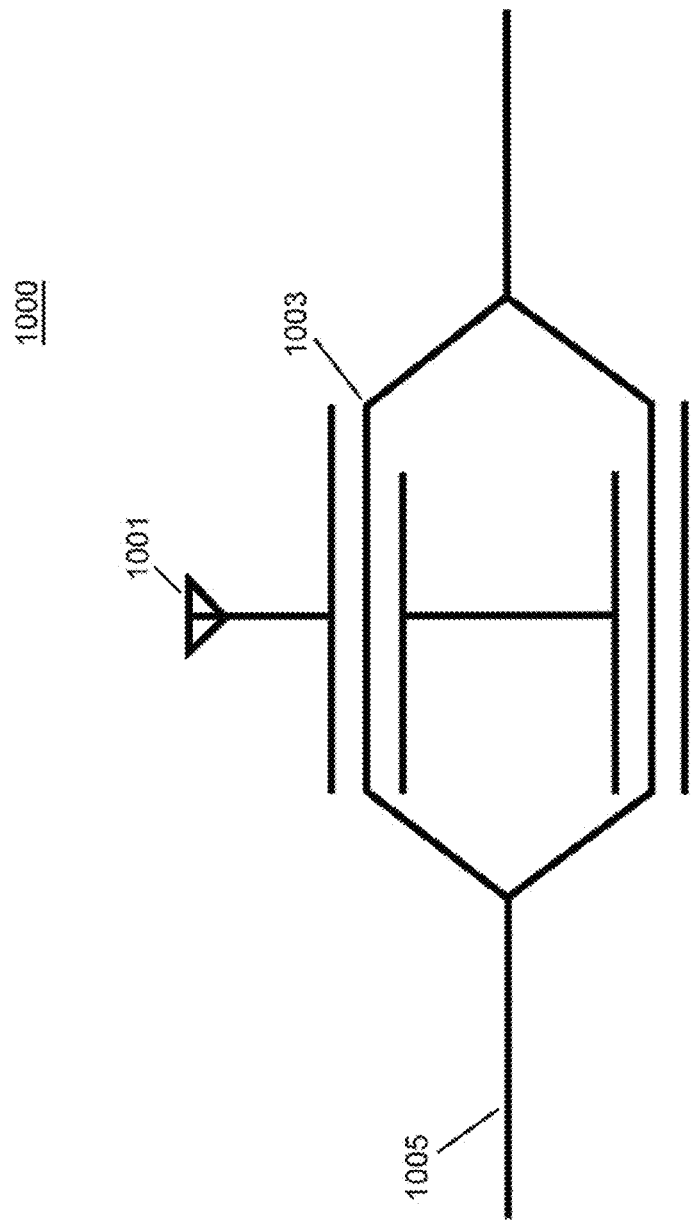
FIG. 22 shows a schematic diagram of one exemplary electric field sensor according to the invention.

We now describe an electric field sensor based on a silicon slot-waveguide hybrid electrooptic polymer modulator. FIG. 22 shows a schematic diagram of one exemplary electric field sensor, an antenna system integrated slot waveguide modulator 1000 according to the invention. Antenna 1001 is shown disposed over a differentially driven slot waveguide Mach-Zehnder. Optical waveguide 1003 optically couples to the Mach-Zehnder. Such antennas can be, for example, printed on-chip using lithographically defined metal strips. If the antenna area is to be about 1 mm$^2$, then the lateral dimension of the modulator can be about 1 mm, which implies an input voltage of 0.1 nV Hz$^{-1/2}$, based on an on-chip antenna.

It is believed that a Mach-Zehnder interferometer with a V$\pi$ value of 6 mV is suitable. This is a factor of 40 times better than we have demonstrated in our previous work, but which is believed to be plausible based on presently available materials. We anticipate that a V$\pi$ value of 6 mV or better can be achieved through the use of E-O organic materials and improved slot waveguide geometries. One suitable exemplary structure includes a slot waveguide with 200 nm tall arms and a 40 nm wide slot, and $r_{33}$ values of 480 pm/V, and a Mach-Zehnder having a 2 cm arm length. Through the use of resist reflow, such a device could be produced with conventional photolithography. Waveguide loss should be 4 dB/cm, which is approximately the value already achieved in electron-beam fabricated samples. These values provide only one exemplary configuration. For example, higher E-O activity can be traded against device length, with benefits in terms of device optical losses. It is also contemplated that the development of more advanced E-O materials with still higher activity than is presently available, can significantly improve system performance.

The desired bandwidth of 0.5 Hz-1.0 GHz should pose no problem since the polymer response time is orders of magnitude faster than this, and silicon electronics routinely operate at higher bandwidths. The laser to be used with an electric field sensor as described herein, could be, for example, a Santur TL-2020-C (available from the Santur Corporation of Fremont, Calif.), which has an RIN of −140 dB/Hz, power of 20 mW, and linewidth of 3 MHz. Assuming 10 dB of optical insertion loss for the Mach-Zehnder, this implies an optical intensity signal of 26 pW Hz$^{-1/2}$. The intensity fluctuations on the laser are 200 pW Hz$^{-1/2}$, however, if a balanced photodetector is utilized, typically a CMRR of −20 dB is achieved, which implies intensity fluctuations of 2 pW Hz$^{-1/2}$. The photon shot noise will be the largest noise source on the signal, which is 16 pW Hz$^{-1/2}$.

Turning now to the photodetector used to detect the modulated light from the electric field sensor, avalanche photodetectors with bandwidths of 1 GHz and conversion gains of 104 V/W are available, such as, for example, the New Focus model 1647 (available from the New Focus Corporation of Santa Clara, Calif.). The noise equivalent power of this particular detector is 1.6 pW Hz$^{-1/2}$, so the noise floor is not an issue.

The detector gain of a low drive voltage modulator electric field sensing system as described herein, would then be on the order of 68 dB, implying that an input signal of 0.1 nV Hz$^{-1/2}$ would become 0.26 µV Hz$^{-1/2}$. The noise limitation of the detector is shot noise, thought to be around 0.16 µV Hz$^{-1/2}$. The noise floor for a 1 Hz resolution RF measurement is typically around −150 dBm up to 1 GHz, based on the performance of commercial RF spectrum analyzers. The noise level for the spectrum analyzer 1 KHz resolution would be around −120 dBm. The measured power for a 1 Hz bandwidth measurement in the case of our proposed system would be −119 dBm, which would also rise by 30 dBm as the bandwidth of the measurement goes to 1 KHz, to −89 dBm. This remains approximately 30 dB above the noise floor of a commercial off-the-shelf spectrum analyzer. We note that the power level for a 1 Hz measurement if 0.1 nV Hz$^{-1/2}$ were it to be measured directly with an electrical system, is −187 dBm, well below the noise floor of these same spectrum analyzers.

One noise source that is hard to quantify in advance is the Johnson noise within the slot waveguide modulator. Typical resistances within a moderately doped semiconductor structure might be 50Ω, which would imply Johnson noise levels of 0.9 nV Hz$^{-1/2}$. It is contemplated that Mach-Zehnder modulator can be made to see lower effective voltage noise by varying electrode geometries, and/or by use of more highly doped semiconductors.

A number of possibilities exist for further uses of the devices and systems discussed herein. For example, if devices were permitted to occupy 1 mm$^2$ areas, but in a non-square configuration, it might be possible to improve performance by an order of magnitude or more, by simply building a longer antenna to gather more voltage. Also, lasers and/or detectors can be integrated directly onto the same silicon substrate with the voltage sensors, in order to reduce overall system size, weight and power. It is contemplated that large arrays of the proposed devices can be built in parallel, e.g. up to wafer-scale (6" or 8") as a single system, including sensors in both X- and Y-orientations. It is also contemplated that such large arrays can be integrated onto a single substrate. It is also contemplated that sensors can be created with an oriented in the Z direction (out of the wafer plane). It is also contemplated that bandwidth significantly beyond the typically desired 1 GHz is achievable in such systems.

In order to improve performance even further it is contemplated that a more powerful laser could be used or possibly several different lasers combined at close wavelengths. If the Mach-Zehnder can be balanced nearly exactly (perhaps with on-chip detectors and feedback), then it should be relatively broadband. The damage threshold of the waveguide and the organic material will probably become a consideration, however, with this strategy.

With integrated optical resonator filters, it will be possible to multiplex many signals onto a single fiber. No voltage input will be required in operation (once the devices are poled), so it is contemplated that a system can be built with a single fiber for both input and output even for a large (e.g. 10×10 or 20×20 element) array of sensors.

Fiber-Based Antenna Link

As discussed hereinabove, a low drive voltage modulator is particularly well suited for use as an electric field sensor. Because of its relatively large input bandwidth, low drive voltage modulator based sensors can also be made responsive to received electromagnetic waves associated with radio communications and RADAR. It is contemplated that a low drive voltage modulator radio antenna system can replace the conventional copper coaxial cable that connects a radio or RADAR apparatus with a remote radio antenna in conventional installations. For example, in transportation applications (e.g. aircraft, ships, boats, or other vehicles), an RF antenna for a communications or RADAR system is typically mounted relatively far from the associated electronics boxes. Remote antenna location (e.g. at the wingtip, tail, or nose cone of an aircraft) presents a problem, as coaxial cable must then be run from the antenna to the central processing location (i.e. the radio or RADAR electronics boxes). The coaxial cable is relatively heavy, and susceptible to varying degrees of electrostatic interference depending on the quality of the copper, aluminum, and/or steel (e.g. copper clad steel) shielding. Furthermore, coaxial cables can have substantial propagation losses, particularly at higher operating frequencies. As a result, a preamplifier positioned immediately after the antenna is generally needed to make up for the cable loss, adding further complexity and weight typically in a sensitive area of the airframe or other structure. Also a preamplifier, while causing weaker signals to become usable, can introduce additional noise that can degrade the overall system performance.

Figure 23:
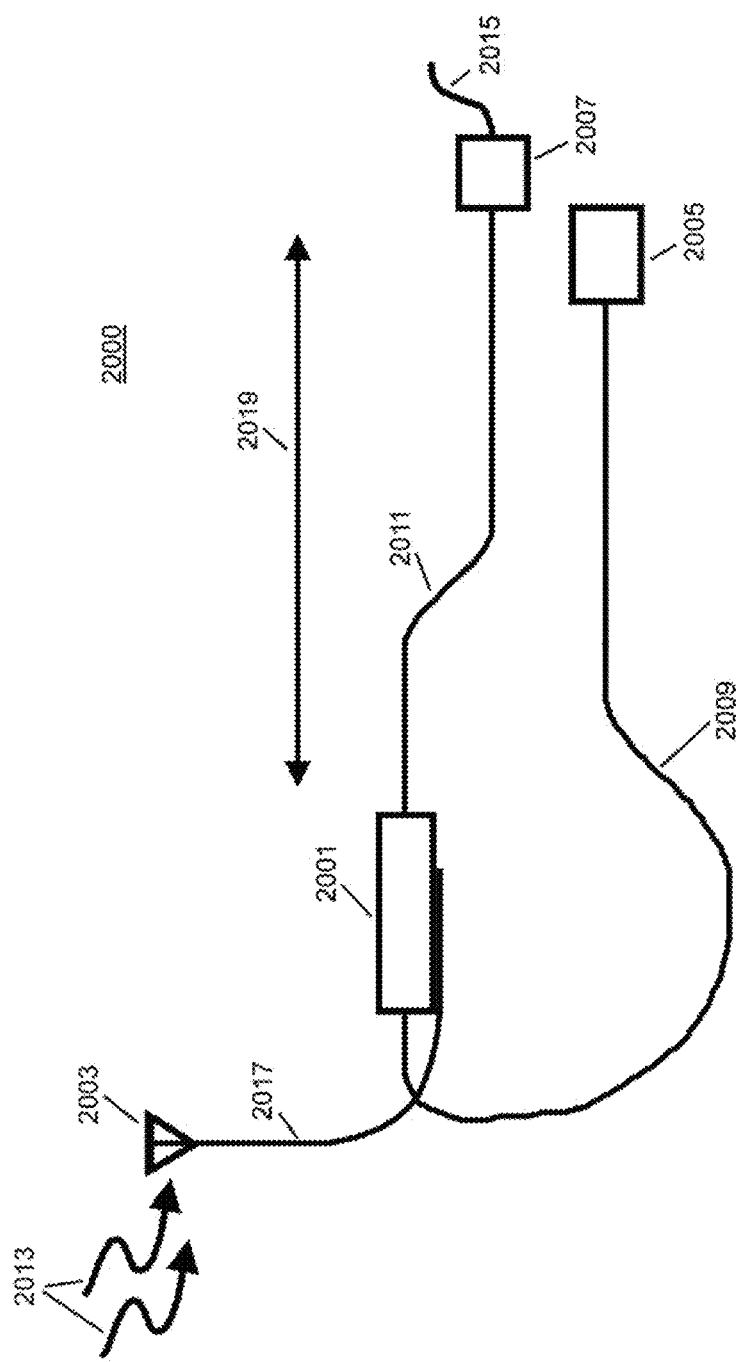
FIG. 23 shows a block diagram of one exemplary embodiment of a photonics based antenna link.

FIG. 23 shows a block diagram of one exemplary embodiment of a photonics based antenna link shown implemented as a low drive voltage modulator antenna link 2000. An RF signal (a voltage) caused by reception of electromagnetic energy 2013 is transferred as an intensity modulation on the optical signal via optical fiber 2011 to a photodetector 2007 at a remote location. The optical signal can travel over a great distance 2019 with little distortion or loss. Moreover, optical fibers 2011 and 2009 (e.g. fiber optic cables) have low weight, do not carry electromagnetic interference and are not susceptible to lightning.

The low drive voltage modulator antenna link 2000 is now described in more detail. Electromagnetic energy 2013 is received via RF antenna 2003. A voltage representative of received electromagnetic wave 2013 is electrically coupled via a cable 2017 (e.g. a relatively short length of conventional coaxial cable suitable for use at the frequency of interest) to a low drive voltage modulator 2001. Low drive voltage modulator 2001 modulates a laser light received from laser 2005 via optic fiber 2009. The light modulated by the voltage representative of received electromagnetic energy 2013 is then propagated via optic fiber 2011 to a photodetector 2015. An electrical signal output from photodetector at RF output 2007 produces a voltage also representative of received electromagnetic wave 2013, thus coupling the received radio waves from antenna 2003 to RF output 2015 via light weight fiber optic cable 2011. Optical fibers 2009 and 2011 can be any type of optical fiber suitable to transmit the wavelength of light of laser 2005, including any suitable type of fiber optic cable.

In one embodiment, a laser 2005 can emit a laser light having a wavelength of about 1550 nm into a fiber, which light progresses to a low drive voltage modulator 2001 that is driven by antenna 2003. The low drive voltage modulator 2001 can be biased at the 3 dB (90 degree) point, which will cause the response of the modulator to be maximally linear to the input voltage representative of received electromagnetic energy 2013.

Note that the combination of the modulator's response and the detector responsivity imply a gain in the system from the RF antenna (e.g. antenna 2003) to the RF output (e.g. RF output 2015). For example, in the case of a 3.5 halfwave voltage for a modulator, and a 15 V/W photodetector, and 20 mW laser, all of which are commonly available commercial values, the RF gain would be −16 dB. On the other hand, if the drive voltage is 0.25 V (as has been demonstrated with slot waveguide based electrooptic polymer modulators) the system gain is +5.6 dB. The RF gain in the system determines the noise figure. If there is substantial RF loss, then small signals that could be otherwise detected with electrical means will be swamped with noise. Therefore, a low drive voltage modulator is particularly well suited as a slot waveguide based modulator for an antenna link.

FIG. 17A, FIG. 17B, and FIG. 17C, as described hereinabove, show diagrams of one suitable slot waveguide based modulator which has a drive voltage of 0.25 V. Such a modulator gains its exceptionally low drive voltage from the fact that the two slot waveguide arms are quite close, perhaps only 40-60 nm apart.

Fiber-Based Antenna Link with Laser Noise Compensation

One problem with lasers is that the output light intensity fluctuates, due to sources of noise, such as relative intensity noise (RIN), within the laser cavity of the laser. One way to compensate for intensity noise is to split the light emitted from the laser in two, where both signals travel to the modulator. In one embodiment of a fiber-based antenna link with laser noise compensation, two modulators can then be driven by the antenna in push-pull configuration, where a positive voltage from the antenna causes one modulator to have an increased transmission, while the other has a decreased transmission. This push-pull configuration enables a balanced photodetector to measure the difference between the two optical intensities and therefore to substantially ignore small laser fluctuations.

Figure 24:
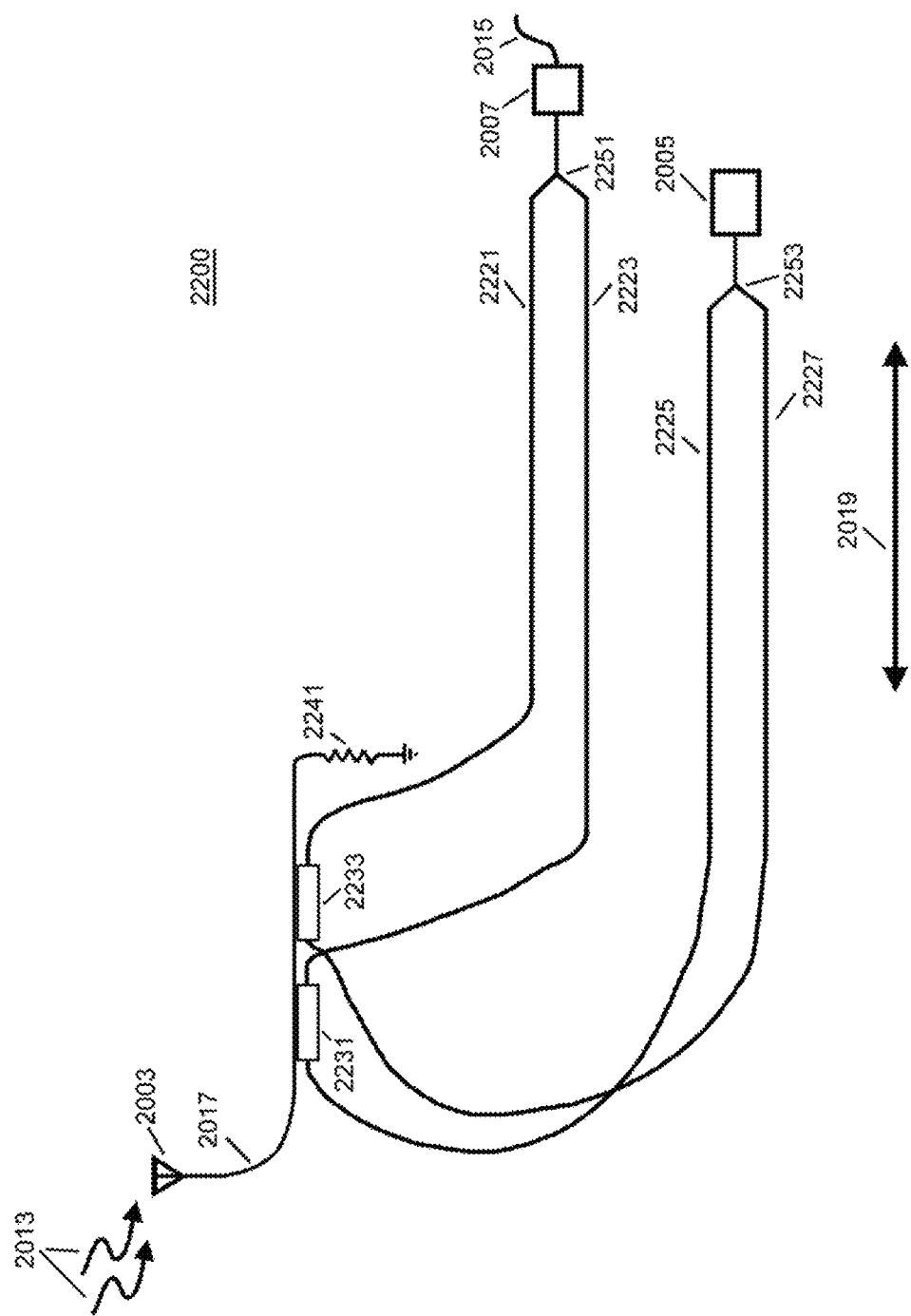
FIG. 24 shows a diagram of one exemplary photonics based noise compensating antenna link.

FIG. 24 shows a diagram of one exemplary photonics based antenna link 2200 having laser noise compensation. Low drive voltage modulators 2231 and 2233 can be electrooptic polymer based slot waveguide modulators, or another suitable type of modulator having a low drive voltage. In addition to the two low drive voltage modulators, the photonics based antenna link 2200 includes a balanced photodetector 2007. Low drive voltage modulators 2231 and 2233 are optically coupled to laser 2005 via a 3 dB splitter 2253 and optical fibers 2225 and 2227 respectively. Antenna 2003 receives electromagnetic energy 2013 (an RF signal) and couples the RF signal to a voltage input terminal or surface of both low drive voltage modulators 2231 and 2233 via transmission line 2017. Transmission line 2017 can be terminated by matched impedance 2241. The RF signal drives low voltage modulator 2231 and low drive voltage modulator 2233 in opposite directions due to a different bias. The modulated output light from low drive voltage modulators 2231 and 2233 is then optically coupled to a balanced photodetector 2007 via optical fibers 2221 and 2223 respectively.

In some embodiments, both low drive voltage modulators 2231 and 2233 can be integrated on the same chip to minimize the time distortion between signals and also to lower insertion loss. Also, with use of the balanced photodetector 2207, the second order nonlinearities in the photodiode are substantially cancelled out. Only third order nonlinearities in the photodetector 2007 will enter in the final system transfer function.

Photodetector

In the description hereinabove, we use the term photodetector to refer interchangeably to a photodetector electro-optical component as well as to a photodetector electronic circuit which includes one or more photodetector components as well as providing signal conditioning and/or amplification of the signal from the photodetector component. For example, in the various antenna link embodiments, it is understood that there might be additional conventional electronic circuitry (e.g. signal conditioning electronics and/or amplifier components) between the photodetector component and the RF output of the antenna link at the radio or RADAR equipment side of the link.

Other Applications

It is believed that the availability of low drive voltage modulator as described herein above, especially in their higher-bandwidth implementations, will result in a radical re-engineering of a variety of analog data communication systems (including both military and civilian applications). Making a high-gain E-O-E (electro-optic effect) transition practical will mean that much lower noise and power consumption will become practical, in particular for antenna-remoting applications. The possibility of building many of these modulators on a single chip opens up a number of new possibilities, including the use of multi-modulator devices to increase linearity of and the creation of low-power chip-scale phased array optical devices for beam steering.

The low power consumption of these devices makes them extremely appealing for data communication in multicore CPU architectures, where hundreds or thousands of modulators would be needed on a single chip; and their low voltage operation opens up entirely new possibilities in areas as diverse as radar systems, imaging, signal processing, and microwave photonics.

With regard to sensor applications, it is believed that the low drive voltage modulator devices described herein and in our related applications and patents cited hereinabove are be beyond the state of the art by orders of magnitude in both speed and sensitivity. For example, it is contemplated that such devices can be used for the probing of RF transmission lines on printed circuit boards where today's approaches tend to require placing probes directly into the signal path, which tends to change the performance of the device under test. With a non-contact or contactless approach, these problems can be greatly reduced. In addition, as described hereinabove, low drive voltage modulator devices are likely to be revolutionary when used for detecting the small electrical fields associated with neural sensing experiments. For example, electric field sensors, including arrays of integrated electric field sensors, as described herein above, can be configured as neural sensors to receive mammalian neural signals.

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An electric field sensor device comprising:
a radio frequency (RF) antenna configured to receive an RF signal;
an optical splitter having a first input and a second input, wherein an output of the optical splitter is coupled to an input of a balanced photodetector;
a first voltage modulator having an input electrically coupled to said RF antenna, said first voltage modulator including:
a first slot waveguide, the first slot waveguide comprising:
a first plurality of silicon strips defining at least one first slot;
a first cladding comprising an electrooptic polymer;
a first light input; and
a first modulated light output coupled to the first input of the optical splitter; and
a second voltage modulator having an input electrically coupled to said RF antenna, said second voltage modulator including:
a second slot waveguide, the second slot waveguide comprising:
a second plurality of silicon strips defining at least one second slot;
a second cladding comprising an electrooptic polymer;
a second light input; and
a second modulated light output coupled to the second input of the optical splitter,
wherein said first slot waveguide is configured to provide a first optical output signal at said first modulated light output having a first optical parameter indicative of an electric field at said RF antenna, and wherein the first modulated light output corresponds to an enhanced electric field associated with an optical mode of the first slot,
wherein said second slot waveguide is configured to provide a second optical output signal at said second modulated light output having a second optical parameter indicative of an electric field at said RF antenna, and wherein the second modulated light output corresponds to an enhanced electric field associated with an optical mode of the second slot, and
wherein said balanced photodetector has an RF output terminal and said balanced location physically remote from said RF antenna, and said RF output signal is responsive to the RF signal received at said RF antenna.

2. The electric field sensor device of claim 1, wherein said first optical parameter is a first intensity of said first optical output signal, and said second optical parameter is a second intensity of said second optical output signal.

3. The electric field sensor device of claim 1, wherein said first and second voltage modulators are integrated with said RF antenna.

4. The electric field sensor device of claim 1, wherein said first and second voltage modulators each comprise Mach-Zehnder interferometers.

5. The electric field sensor device of claim 1, wherein said first and second voltage modulators each have a drive voltage of about 0.25 V or less.

6. The electric field sensor device of claim 1, wherein a bandwidth of the electric field sensor device is equal to or greater than 1 GHz.

7. The electric field sensor device of claim 1, wherein said electric field sensor device is configured for a non-contact sensing of an electric field.

8. The electric field sensor device of claim 1, wherein said non-contact sensing of an electric field comprises a non-contact probing of RF transmission lines on a printed circuit board.

9. The electric field sensor device of claim 1, wherein said electric field sensor device is integrated onto a single substrate.

10. The electric field sensor device of claim 1, further comprising a plurality of optical voltage modulator electric field sensors.

11. The electric field sensor device of claim 10, wherein said plurality of optical voltage modulator electric field sensors is integrated onto a single substrate.

12. The electric field sensor device of claim 10, wherein said optical voltage modulator electric field sensors are configured as neural sensors to receive mammalian neural signals.

13. The electric field sensor device of claim 10, wherein said optical voltage modulator electric field sensors are configured as elements of a phased array antenna.

14. The electric field sensor device of claim 10, wherein said optical voltage modulator electric field sensors are configured as elements of a multicore central processing unit architecture.

15. The electric field sensor device of claim 1, further comprising:
a laser optically coupled to said first light input via a first optical fiber and optically coupled to said second light input via a second optical fiber.

16. The electric field sensor device of claim 1, wherein said first voltage modulator comprises a Mach-Zehnder interferometer and said second voltage modulator comprises a Mach-Zehnder interferometer.

17. The electric field sensor device of claim 1, wherein the width of the first slot and the width of the second slot are each 20 nanometers or less and the width of the second slot is 20 nanometers or less.

18. The electric field sensor device of claim 1, wherein the width of the first slot and the width of the second slot are each between 1 nanometer and 5 nanometers.

19. The electric field sensor device of claim 1, wherein the balanced photodetector is further configured to eliminate second order non-linearities from the RF output signal.

20. The electric field sensor device of claim 1, wherein each of the first slot waveguide and second slot waveguide are configured to minimize Johnson noise levels.

21. The electric field sensor device of claim 20, wherein each of the first slot waveguide and second slot waveguide are made from highly doped semiconductors.

* * * * *